United States Patent
Tamari et al.

(10) Patent No.: US 9,741,579 B2
(45) Date of Patent: Aug. 22, 2017

(54) PLASMA PROCESSING APPARATUS AND PLASMA PROCESSING METHOD

(71) Applicant: Hitachi High-Technologies Corporation, Minato-ku, Tokyo (JP)

(72) Inventors: Nanako Tamari, Tokyo (JP); Michikazu Morimoto, Tokyo (JP); Naoki Yasui, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/846,736

(22) Filed: Sep. 5, 2015

(65) Prior Publication Data

US 2016/0254163 A1 Sep. 1, 2016

(30) Foreign Application Priority Data

Feb. 27, 2015 (JP) .................................. 2015-037624

(51) Int. Cl.
*H01L 21/3065* (2006.01)
*H01L 21/67* (2006.01)
*H01J 37/32* (2006.01)

(52) U.S. Cl.
CPC .. *H01L 21/30655* (2013.01); *H01J 37/32146* (2013.01); *H01J 37/32568* (2013.01); *H01J 37/32715* (2013.01); *H01J 37/32935* (2013.01); *H01J 37/32963* (2013.01); *H01L 21/67253* (2013.01)

(58) Field of Classification Search
None
See application file for complete search history.

(56) References Cited

U.S. PATENT DOCUMENTS

| | | |
|---|---|---|
| 2008/0236492 A1 | 10/2008 | Yamazawa |
| 2010/0243607 A1 | 9/2010 | Ohse et al. |
| 2011/0253672 A1 | 10/2011 | Kamibayashi et al. |

FOREIGN PATENT DOCUMENTS

| | | |
|---|---|---|
| JP | 2001-319920 A | 11/2001 |
| JP | 2002-141340 A | 5/2002 |
| JP | 2008-244063 A | 10/2008 |
| JP | 2014-007429 A | 1/2014 |
| KR | 2011-0116955 A | 10/2011 |

OTHER PUBLICATIONS

Office Action dated Aug. 23, 2016 for related Korean Patent Application No. 10-2015-0122020.

*Primary Examiner* — Allan Olsen
(74) *Attorney, Agent, or Firm* — Miles & Stockbridge P.C.

(57) ABSTRACT

A plasma processing apparatus includes a sample stage disposed in a processing chamber within a vacuum chamber. A wafer mounted on a top surface of the sample stage is processed by using plasma formed in the processing chamber. The plasma processing apparatus further includes electrodes disposed on a part on a center side and a part on a peripheral side within the sample stage and supplied with radio frequency power. Large amplitude and small amplitude are repeated with a predetermined period in each of the radio frequency powers supplied respectively to the electrode on the center side and the electrode on the peripheral side. A control apparatus adjusts a length of large amplitude term, or the length of the large amplitude term and a ratio of the length to a period in each of the radio frequency powers to different values.

4 Claims, 19 Drawing Sheets

| (a) | No. | RF BIAS | | SiN | | | |
|---|---|---|---|---|---|---|---|
| | | CENTER | EDGE | CENTER | EDGE | Ave | Uni |
| | 1 | (I) | (I) | 61.4 | 68.7 | 65.1 | 5.6 |
| | 2 | (J) | (J) | 69.5 | 75.3 | 72.4 | 4.0 |
| | 3 | (J) | (I) | 69.5 | 68.7 | 69.1 | 0.6 |

(S) EF CONTROL PULSE OUTPUT (I) RF POWER SUPPLY OUTPUT (J) RF POWER SUPPLY OUTPUT (a)

| No. | RF BIAS | | Poly | | | |
|---|---|---|---|---|---|---|
| | CENTER | EDGE | CENTER | EDGE | Ave | Uni |
| 1 | (I) | (I) | 47.9 | 44.3 | 46.1 | 3.9 |
| 2 | (J) | (J) | 44.5 | 41.1 | 42.8 | 4.0 |
| 3 | (J) | (I) | 44.5 | 44.3 | 44.4 | 0.2 |

FIG. 26
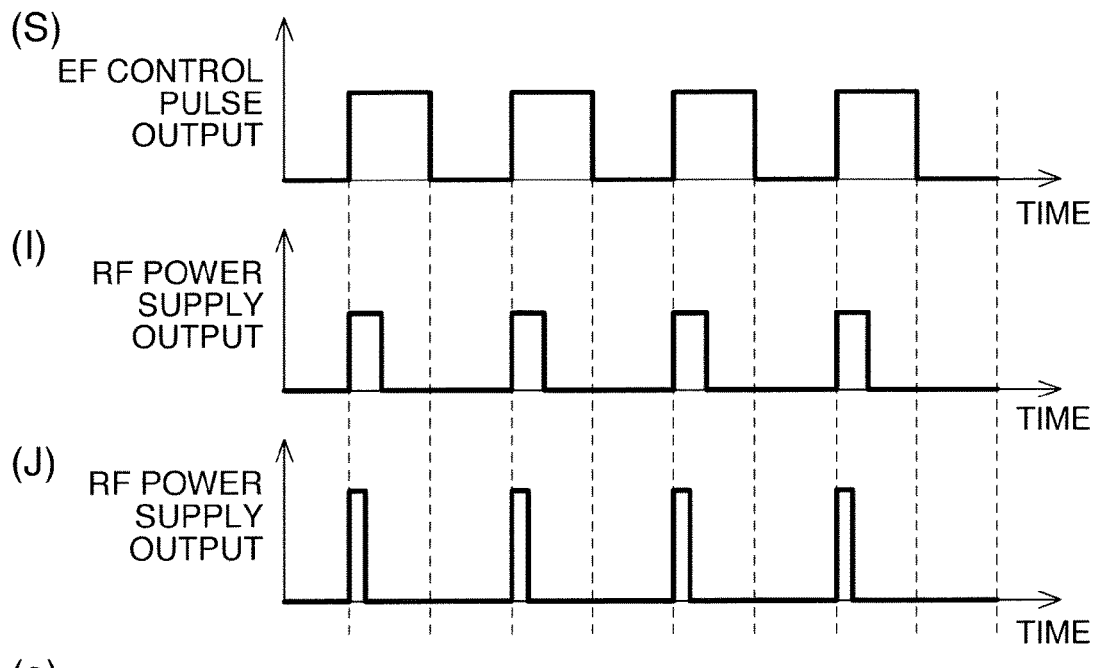
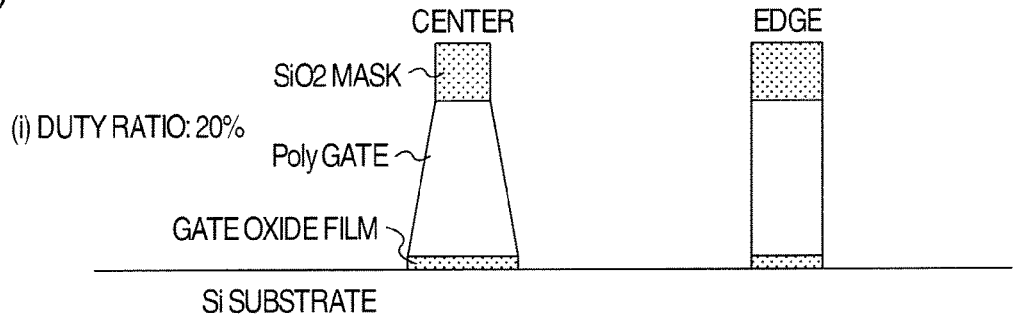
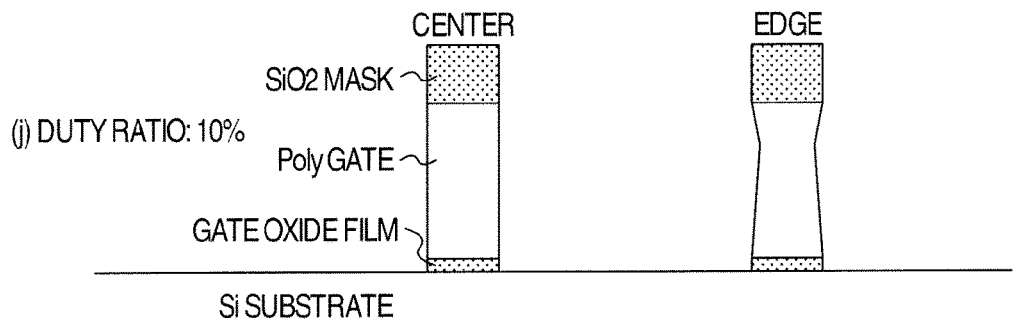

PLASMA PROCESSING APPARATUS AND PLASMA PROCESSING METHOD

BACKGROUND OF THE INVENTION

The present invention relates to a plasma processing apparatus and a plasma processing method. The plasma processing apparatus includes a processing chamber in a vacuum chamber and a sample stage disposed within the processing chamber to mount a substrate-shaped sample, such as a semiconductor wafer, on a top surface thereof. In the plasma processing apparatus, the sample is processed by using plasma formed in the processing chamber. The present invention relates to a plasma processing apparatus or a plasma processing method in which processing of the sample is executed by supplying radio frequency (RF) power to an electrode disposed within the sample stage while forming plasma.

In the manufacture process of semiconductor devices, etching processing of the sample using the above-described plasma processing apparatus, i.e., the so-called dry etching is generally conducted. As for the plasma processing apparatus for conducting such etching, various systems are used. Formerly, such a plasma processing apparatus includes a processing chamber, a gas supply apparatus, a vacuum pumping apparatus, a lower electrode, and a plasma generation unit. The processing chamber is a space disposed within the vacuum chamber to conduct processing. The gas supply apparatus includes a path connected to the vacuum chamber and communicated with inside of the processing chamber to supply process gas to the processing chamber. The vacuum pumping apparatus includes a vacuum pump, such as a turbo-molecular pump, to decompress the inside of the processing chamber and adjust the pressure to a value in a desired range suitable for processing. The lower electrode is a sample stage. A substrate-shaped sample, such as a semiconductor wafer, is mounted on a dielectric film disposed on the sample stage. The plasma generation unit includes a means for generating an electric field (EF) and a magnetic field supplied to generate plasma in the processing chamber.

A sample is mounted on the top surface of the sample stage. In this state, process gas is supplied into the processing chamber from a gas supply opening, such as a shower plate, which forms a ceiling of the processing chamber. The electric field or the magnetic field supplied by the generation means excites the process gas and brings about a plasma state. As a result, plasma is formed in a space over the sample stage in the processing chamber. In this state, a disk or cylindrical shaped electrode made of metal disposed within the sample state and connected electrically to a radio frequency power supply is supplied with radio frequency (RF) power. Consequently, a bias potential depending upon potential of plasma is formed over the sample. As a result, charged particles in the plasma are attracted to the top surface of the sample to collide with the top surface. In this way, etching processing of a film structure including a mask and a film layer to be processed, disposed on the top surface of the sample previously is started.

In the semiconductor manufacture process in recent years, a limit of size shrinking using optical lithography has been approached. Processes such as multiple exposure or spacer patterning are becoming the mainstream. In such multiple exposure and the spacer patterning process represented by SADP (Self Aligned Double Patterning), the etching processes increase.

Slight uniformity lowering of etching performance caused in the wafer surface in respective etching processes is accumulated by increase of etching processes. As the number of processes increases, it becomes difficult to allow even slight uniformity lowering in the wafer surface. In the semiconductor manufacture process represented by leading edge logic, especially in the FEOL (Front End Of Line) process, therefore, high precision control of the uniformity in the wafer surface of the etching performance is demanded. Specifically, controllability having a high degree of freedom in etching depth in the wafer surface, CD distribution control, and control from convex distribution to concave distribution is needed.

For example, in the etching process of an SIN film, etching is hampered by high concentration byproducts distributing in a central part of a wafer. In some cases, the etching rate becomes low in the central part of the wafer and the etching rate becomes high in a peripheral part of the wafer. As a result, the etching rate in the wafer surface becomes concave distribution in the radius direction. In the etching process of a poly-Si film and so forth, the plasma density becomes the highest near the center of a reactor, and becomes gradually lower as the position approaches an inner wall of the reactor. Because of such uneven distribution, the etching rate becomes high in the center part of the wafer and the etching rate becomes low in the peripheral part of the wafer. As a result, the etching rate in the wafer surface becomes convex distribution in the radius direction in some cases.

In order to solve such insufficient uniformity of the etching rate in the wafer surface, formerly etching rate uniformalizing has been conducted by condition retrieval and condition optimization of etching recipe such as the kind and pressure of process gas. This poses a problem such as increase of the number of times of evaluation attendant upon the condition retrieval and consequent increase in time and cost.

If parameters such as radio frequency power for generating plasma and a magnetic field condition for controlling plasma distribution are changed to change plasma characteristics, not only plasma distribution but also plasma characteristics, especially the radical density and distribution, plasma density and distribution, and wafer temperature attendant upon a change of ion quantity change simultaneously. In this way, complicated correlations among mutual parameters exist. In the convention apparatuses, therefore, it becomes often difficult to conduct process construction that reconciles the etching material selectivity and the etching rate uniformity.

As a technique for improving the unifoimity of the etching rate against such a problem, a technique disclosed in JP-A-2008-244063 is formerly known. With respect to the top surface direction of a sample stage mounting a wafer, which is a sample, magnitude of a current of RF power (RF biasing power) for forming a bias in the wafer surface is adjusted by using variable impedances connected between a plurality of divided electrodes and an RF biasing power supply. It is stated in JP-A-2008-244063 that uniformity of etching is implemented by adjusting the magnitude of the current of RF power.

Furthermore, JP-A-2002-141340 and JP-A-2001-319920 also disclose a technique of adjusting a current of a radio frequency for forming bias potential with respect to the inside of the wafer surface or the top surface direction of the lower electrode. In JP-A-2002-141340, an electrode is disposed within a sample stage on a periphery side of a sample mounting surface to surround the sample mounting surface.

A bias current is leaked from an RF biasing power supply to the electrode via a variable impedance element. As a result, occurrence of charging damage on the sample due to charged particles, such as electrons, in plasma attracted by bias potential is suppressed. In this way, the yield is prevented from lowering. In JPA-2001-319920, the lower electrode is disposed to be divided into a plurality of sections in a radius direction of a mounting surface. Respective sections are connected to a biasing power supply circuit having a variable impedance element thereon. In such a configuration, the variable impedance value is adjusted to make ion energy incident on a wafer, which is a sample, uniform in an in-surface direction. In this way, it is attempted to suppress occurrence of charging damage of the wafer.

SUMMARY OF THE INVENTION

In the above-described conventional techniques, consideration concerning the following points is insufficient, resulting in a problem. In other words, as for JPA-2008-244063, JP-A-2002-141340, and JP-A-2001-319920, it is found that improvement of uniformity in the etching performance in the wafer surface is noticeable, but insufficient.

In technique of setting the ion energy to a desired value by adjusting the value of the variable impedance element in the configuration disclosed in JP-A-2008-244063, JPA-2002-141340, and JP-A-2001-319920, non-unifoimity of the etching rate in the in-surface direction of the surface can be suppressed. However, the ion energy itself is adjusted. Because of suppression of the non-uniformity, therefore, the ion energy incident on the wafer exerts an influence upon the degree of progress of the etching processing, for example, the etching rate as well. Consequently, the degree of progress of the etching processing becomes insufficient or surplus in some cases. For example, in a case where the ion energy is insufficient as compared with a threshold for occurrence of etching progress, etching does not progress as far as a desired depth, resulting in a problem called etch stop.

In a case where the ion energy value is too large, the following result is brought about even if processing is conducted under an etching processing condition that is set previously supposing that processing with a proper energy value is executed. That is, the etching proceeds beyond an expected depth, the etching reaches the underlying layer because of a lowered selectivity of the etching, or excessive shaving occurs because of an insufficient mask film thickness. Consequently, the CD value after the processing of the sample gets out of an allowable range, resulting in a problem of a lowered yield of processing.

As for the distribution control of ion energy in the wafer surface, it can be expected that uniformity in the wafer surface is obtained in a range in which the ion energy is sufficiently high as compared with an etching threshold and a threshold for excessive etching performance is not exceeded, as described heretofore. Outside the range, however, there is rather a possibility that lowering in yield will occur because of etch stop or over-etch. There is a limit in application range.

Furthermore, because of increase of multi-step processes such as multiple exposure in recent years, the range in which ion energy control is possible is shrunk year by year. In the conventional technique, it has become difficult to limit the non-uniformity of processing in the in-surface direction of the wafer into a demanded range. In this way, in the conventional technique, process design is often difficult because of correlation among internal parameters. Furthermore, in the techniques disclosed in JP-A-2008-244063, JP-A-2002-141340, and JP-A-2001-319920, etch stop or over-etch occurs because of insufficient or excessive ion energy as described above. Consequently, uniformity in the in-surface etching rate and pattern shape after etching lowers, resulting in a problem of worsened yield.

Furthermore, it is known that the following problems occur in the etching process of SiN. That is, etching in the central part of the wafer is hampered because the concentration of byproducts in the central part of the wafer becomes high. The etching rate becomes non-uniform in the surface because the etching rate assumes a concave shape in the radius direction. Etch stop is caused by excessive byproducts. In JP-A-2008-244063, JP-A-2002-141340, and JP-A-2001-319920, it is attempted to make the etching rate uniform by controlling pull-in energy distribution of ions in the in-surface direction of the wafer. However, it has been found to be difficult to obtain expected processing dimensions and distribution by adjusting a process in which the etching rate is restricted by byproducts, such as the above-described SiN process. The following fact is obtained by study conducted by the present inventors as knowledge. That is, for bringing the etching rate in the in-surface direction of the wafer in such processing close to uniform, it is necessary to not only control the distribution of ion energy in the in-surface direction of the wafer, but also control the distribution of concentration of byproducts in the in-surface direction of the wafer.

It is an object of the present invention to provide a plasma processing apparatus and a plasma processing method improved in uniformity and yield of sample processing.

The above-described object is achieved by a plasma processing apparatus including a sample stage disposed in a processing chamber within a vacuum chamber. A wafer mounted on a top surface of the sample stage is processed by using plasma formed in the processing chamber. The plasma processing apparatus further includes electrodes disposed on a part on a center side and a part on a peripheral side within the sample stage and supplied with radio frequency power. Large amplitude and small amplitude are repeated with a predetermined period in each of the radio frequency powers supplied respectively to the electrode on the center side and the electrode on the peripheral side. A control apparatus adjusts a length of large amplitude term, or the length of the large amplitude term and a ratio of the length to a period in each of the radio frequency powers to different values.

Embodiments of a plasma processing method include disposing a wafer to be processed on a sample stage within a processing chamber in a vacuum chamber; generating plasma in the processing chamber; supplying first radio frequency power to an electrode disposed on a part on a center side within the sample stage; supplying second radio frequency power to an electrode disposed on a part on a peripheral side within the sample stage, in which a large amplitude and a small amplitude in each of the first and second radio frequency powers are repeated with predetermined periods which are respectively set in each of the first and second radio frequency powers; detecting rates of processing the wafer surfaces located at positions respectively corresponding to the part of the center side and the part of the peripheral side during the processing of the wafer surface; and adjusting, at least in one of the first and second radio frequency powers, a length of the large amplitude term, or a ratio of the length of the large amplitude term to one of the predetermined periods during the processing of the wafer based upon a result of the detected rates.

The present invention brings about an effect that the uniformity of the etching rate from the central part of the wafer to the peripheral part is improved and especially electrical characteristics and performance of the semiconductor device in the whole surface of the wafer do not vary, resulting in yield improvement. Furthermore, the present invention brings about an effect that the etching shape can be controlled with high precision in the wafer surface and electrical characteristics and performance of the semiconductor device in the wafer surface do not vary, resulting in yield improvement.

Other objects, features and advantages of the invention will become apparent from the following description of the embodiments of the invention taken in conjunction with the accompanying drawings.

BRIEF DESCRIPTION OF THE DRAWINGS

FIG. 26 is a time chart of plasma forming power and RF substrate biasing power and longitudinal sectional views showing a result of processing in another modification of the embodiment shown in FIG. 22.

DESCRIPTION OF THE EMBODIMENTS

Hereafter, embodiments of the present invention will be described with reference to the drawings.

Embodiment 1

Figure 1:
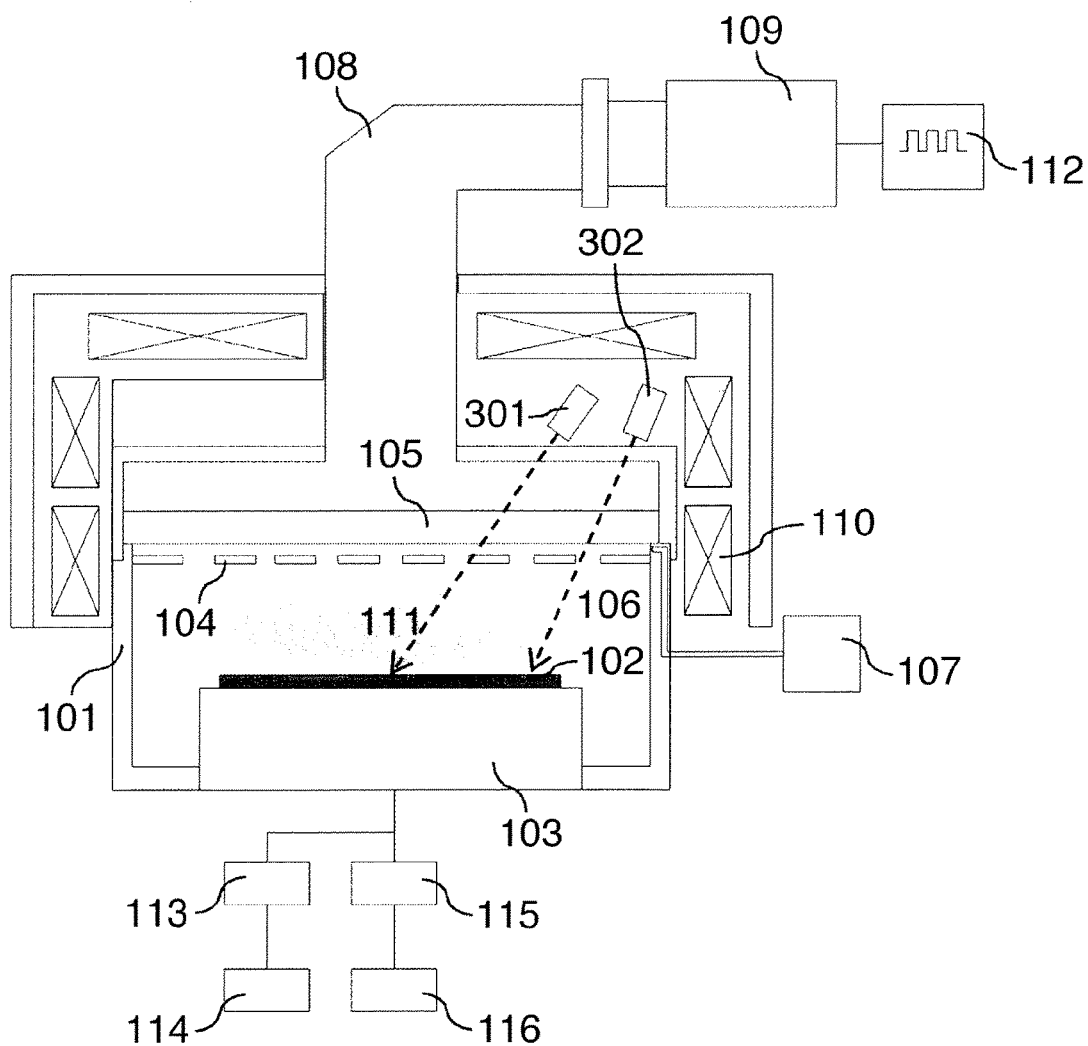
FIG. 1 is a longitudinal section view schematically showing an outline of a configuration of a plasma processing apparatus according to an embodiment of the present invention.

Hereafter, an embodiment of the present invention will be described with reference to FIGS. 1 to 21. FIG. 1 is a longitudinal sectional view schematically showing an outline of a configuration of a plasma processing apparatus according to an embodiment of the present invention. The plasma processing apparatus in the present example is an apparatus configured to conduct etching processing on a sample such as a semiconductor wafer mounted on a top surface of a sample stage and held by electrostatic chuck in a processing chamber within a vacuum chamber, by using plasma formed in the processing chamber. The plasma processing apparatus in the present example is a microwave ECR (Electron Cyclotron Resonance) etching apparatus that uses a microwave as an electric field for forming plasma and excites gas in the processing chamber to convert the gas to plasma by electron cyclotron resonance caused by interaction between the microwave and a magnetic field.

In the plasma processing apparatus according to the present embodiment, a vacuum chamber 101 has a cylindrical shaped processing chamber 106 therein and takes a cylindrical shape opened upward. A dielectric window 105 (made of, for example, quartz) is mounted on top ends of the vacuum chamber 101 to seal etching gas within the vacuum chamber 101. A bottom surface of an outer peripheral portion of the dielectric window 105 and a top surface of a cylindrical side wall top end portion are opposed to each other and coupled with a seal means such as an O ring between them. As a result, the processing chamber 106 having an inside hermetically sealed against an outside is formed.

A shower plate 104 is disposed under the dielectric window 105 disposed on the upper part of the vacuum chamber 101. The shower plate 104 forms a ceiling surface of the processing chamber 106 in the vacuum chamber 101. A plurality of through holes is disposed through the shower plate 104 to introduce etching gas into the processing chamber 106. The shower plate 104 takes a disk shape. The shower plate 104 is made of a material (for example, quartz) that can transmit an electric field. Furthermore, in the present embodiment, a gap is disposed between the shower plate 104 and the dielectric window 105. A gas supply apparatus 107 is coupled to the gap to let etching gas flow. The etching gas supplied from the gas supply apparatus 107 is introduced into the gap, and diffused within the gap. Then, the etching gas is introduced into the processing chamber 106 from above through the through holes of the shower plate 104.

A vacuum pumping opening communicating with a bottom part of the processing chamber 106 is disposed in a lower part of the vacuum chamber 101. A vacuum pumping apparatus including vacuum pumps in turbo-molecular pumps is coupled to the vacuum chamber 101 to communicate with the vacuum pumping opening. The plasma processing apparatus according to the present example is configured to adjust pressure in the processing chamber 106 in the vacuum chamber 101 by balance between the rate and speed of gas supplied via the shower plate 104 and the rate and speed of exhaust exhausted from the vacuum pumping opening.

In addition, a waveguide 108 is disposed over the dielectric window 105 in the present example to transmit power for generating plasma to the processing chamber 106. An electric field generated from a power supply to form plasma propagates within the waveguide 108. Depending upon the frequency of the electric field, a disk shaped antenna connected to the power supply via a cable or the like is disposed. The electric field transmitted to the waveguide 108 (or the antenna) is oscillated from an electric field generating power supply 109. The frequency of the electric field is not especially restricted. In the present embodiment, however, a microwave of 2.45 GHz is used.

In the present embodiment, a pulse modulation signal generator 112 is connected to the electric field generating power supply 109 to make it possible to form plasma with predetermined periods and durations intermittently and execute sample processing. In addition, a magnetic field generating coil 110 (solenoid coil) is disposed outside a side wall of the vacuum chamber 101 surrounding the outer circumference of the processing chamber 106 to surround the side wall. The magnetic field generating coil 110 forms a magnetic field.

A cylindrical shaped wafer-mounting electrode 103 is provided in a lower part of the processing chamber 106. A top surface of the wafer-mounting electrode 103 is opposed to the dielectric window 105 or the shower plate 104. A wafer is mounted and held on the top surface of the wafer-mounting electrode 103. The wafer-mounting electrode 103 includes a cylindrical base material made of metal disposed inside. A film made of a dielectric (not illustrated) formed by spraying a dielectric material is disposed on the top surface of the wafer-mounting electrode 103 to cover the top surface.

A film shaped electrode made of metal is contained and disposed within the film made of the dielectric (dielectric film). A direct current power supply 116 is connected to the electrode via a radio frequency filter circuit 115. In addition, an RF substrate biasing power supply 114 is connected to the electrode within the wafer-mounting electrode 103 via a matching circuit 113 as described later.

A different vacuum chamber, which is not illustrated, is coupled to the side wall of the vacuum chamber 101. The wafer 102 is mounted on an arm of a conveyance robot disposed within the different vacuum chamber and conveyed in a depressurized space within the different vacuum chamber. The arm extends and the wafer 102 is conveyed into the processing chamber 106. The wafer 102 is delivered to the wafer-mounting electrode 103 and mounted on the top surface of the wafer-mounting electrode 103. Electrostatic force is formed between the top surface of the dielectric film and a bottom surface of the wafer 102 by the direct current voltage applied to the electrode in the dielectric film from the direct current power supply 116. The wafer 102 is adsorbed to and held on the top surface of the dielectric film by the electrostatic force.

In this state, etching gas for processing is supplied into the processing chamber 106 from the through holes of the shower plate 104. If it is detected that the inside of the processing chamber 106 has reached a predetermined pressure suitable for processing, an electric field having a predetermined frequency oscillated by the electric field generating power supply 109 propagates through the waveguide 108 and is introduced into the processing chamber 106. Gas is excited by interaction between the electric field and the magnetic field supplied from the magnetic field generating coil 110. As a result, high density plasma 111 is formed in the processing chamber 106. Radio frequency power is applied from the RF substrate biasing power supply 114 connected to the wafer-mounting electrode 103. Consequently, bias potential is formed over the top surface of the wafer 102 depending upon potential of the plasma 111. Charged particles such as ions within the plasma 111 are attracted to the top surface of the wafer 102, and the film to be processed in the film structure on the top surface is subject to etching processing.

Figure 2:
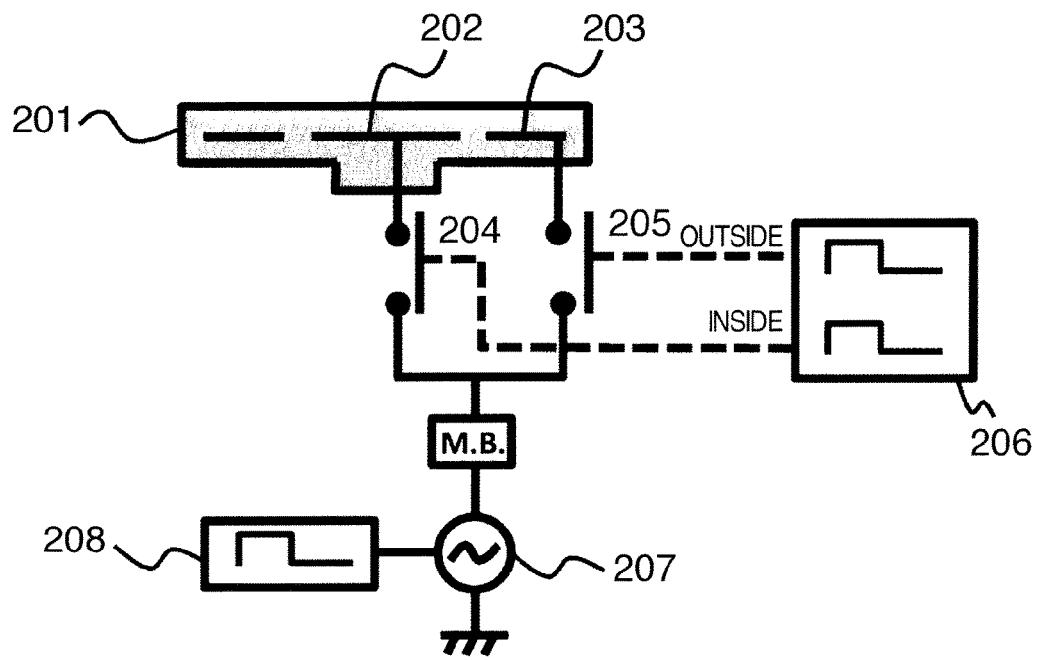
FIG. 2 is a schematic enlarged view showing a configuration of a wafer-mounting electrode in the embodiment shown in FIG. 1.

The configuration of the wafer-mounting electrode in the present embodiment will now be described in more detail with reference to FIG. 2. FIG. 2 is a schematic enlarged view showing the configuration of the wafer-mounting electrode in the embodiment shown in FIG. 1.

FIG. 2 schematically shows a dielectric film 201, an inside electrode 202, an outside electrode 203, an RF substrate biasing power supply 207, and control circuits, which are extracted from the wafer-mounting electrode 103. The dielectric film 201 forms a top surface of the wafer-mounting electrode 103. The inside electrode 202 and the outside electrode 203 are film-shaped electrodes disposed within the dielectric film 201. The inside electrode 202 is disposed on a center side. The outside electrode 203 is a ring-shaped electrode disposed on a peripheral side of the inside electrode 202. The RF substrate biasing power supply 207 are connected electrically to the inside electrode 202 and the outside electrode 203 to supply radio frequency power and attract ions into the wafer 102. The control circuits are connected electrically to the RF substrate biasing power supply 207, the inside electrode 202, and the outside electrode 203 to adjust supply of power.

The present example has a configuration in which radio frequency (RF) power from the RF substrate biasing power supply 207 is divided to two branches and supplied to the inside electrode 202 and the outside electrode 203, respectively. When viewed from over the wafer 102, the inside electrode 202 and the outside electrode 203 are disposed respectively in a center side area and a ring-shaped area on the peripheral side in a radius direction of the wafer 102. The inside electrode 202 and the outside electrode 203 are disposed in the dielectric film 201 to be equal or nearly equal in area.

Each of the inside electrode 202 and the outside electrode 203 may not be a single electrode, but may be formed of a set of a plurality of film shaped electrodes. Each of the inside electrode 202 and the outside electrode 203 is connected electrically to the direct current power supply 116 via the radio frequency filter circuit 115. Direct current voltages having different polarities are applied to the inside electrode 202 and the outside electrode 203, respectively. As a result, electrostatic force is formed by charges stored in the dielectric film 201. The wafer 102 is adsorbed toward the top surface of the dielectric film 201 and held on the wafer-mounting electrode 103 by the electrostatic force. In FIG. 2, two direct current supplies connected to each of the inside electrode 202 and the outside electrode 203 are not illustrated.

In the present embodiment, supply of power to the inside electrode 202 is adjusted by the control circuit. As a result, characteristics of etching processing in the center part of the wafer 102 located over the inside electrode 202 are adjusted. Supply of power to the outside electrode 203 is adjusted by a control apparatus. As a result, characteristics of etching processing in the peripheral part of the wafer 102 located over the outside electrode 203 are adjusted. Branched radio frequency power from the RF substrate biasing power supply 207 is connected to electrical high-speed relays 204 and 205 via a matching box (M.B. in FIG. 2) to transmit radio frequency power to inside and outside ESC films. In the relays 204 and 205, switching is conducted between ON and OFF.

The electrical high-speed relays 204 and 205 are connected electrically to a timing controller 206. The timing controller 206 sends a square wave signal or a pulse shaped signal to the electrical high-speed relays 204 and 205 to turn on or off the electrical high-speed relays 204 and 205 with predetermined periods and durations. A pulse modulation signal generator 208 may be connected to the RF substrate biasing power supply 207 to apply bias power to the inside electrode 202 and the outside electrode 203 intermittently.

Figure 3:
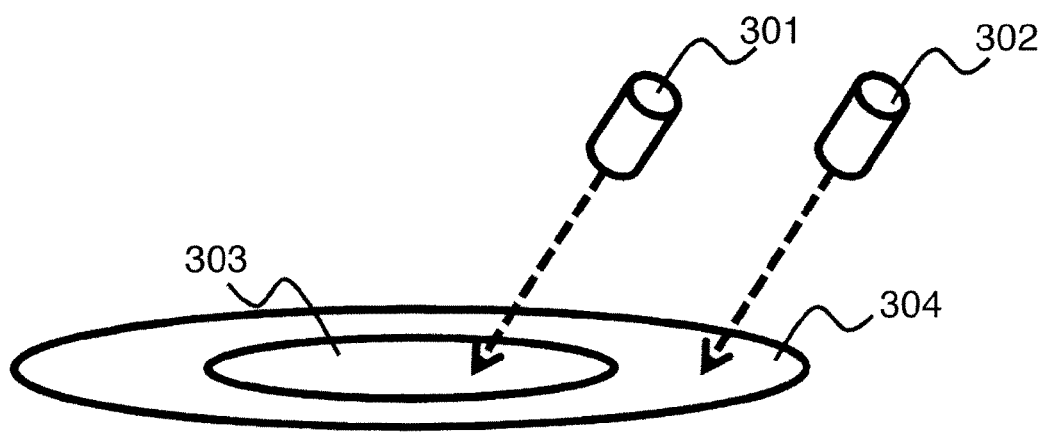
FIG. 3 is a schematic view showing a configuration for detecting film thickness using film thickness monitors in the embodiment shown in FIG. 1.

In the vacuum chamber 101 in the plasma processing apparatus according to the present embodiment, film thickness monitors 301 and 302 are disposed over the dielectric window 105. The film thickness monitors 301 and 302 are detectors for detecting thickness of a film under processing in a film structure at the center and in a predetermined position on the peripheral side of the wafer 102 taking the shape of a disk. FIG. 3 schematically shows a configuration for detecting film thickness using the film thickness monitors 301 and 302.

In the present example, each of the film thickness monitors 301 and 302 includes an optical detector. The optical detectors detect light from a specific place in a circular center part 303 of the wafer 102 and a specific place in a ring-shaped peripheral part 304, and output results. Results of outputs are transmitted to a control apparatus that is connected via a communication means such as a cable, a communication circuit, or a network and that is not illustrated. The control apparatus detects a remaining film thickness of a processing target in the film structure or depth of a groove or a hole, and adjusts the condition of the operation or processing of the plasma processing apparatus on the basis thereof.

The plasma processing apparatus according to the present embodiment adjusts a variable value of time over which RF substrate biasing power is applied in the in-surface direction of the wafer 102. Or adjustment of period and ratio (duty) of ON and OFF terms of the RF substrate biasing power supply 114 or 207, and adjustment of the duty of the RF substrate biasing power supply 114 or 207 based on the outputs of the film thickness monitors are conducted. In this way, non-uniformity of the etching processing in the in-surface direction of the wafer 102 is suppressed.

In the present embodiment, the time over which the RF substrate biasing power is applied to each of the inside electrode 202 and the outside electrode 203 is adjusted by increasing or decreasing the duty, which is a control parameter of the RF substrate biasing power, by use of the timing controller 206 or the pulse modulation signal generator 208. In other words, each of the electrical high-speed relays 204 and 205 is switched between connection (ON) and disconnection (OFF) for the bias power-supply path in response to values of two pulse wave or square wave signals supplied from the timing controller 206, which increase and decrease with predetermined periods and durations. Alternatively, two pulse wave or square wave signals supplied from the pulse modulation signal generator 208, which increase and decrease with predetermined periods and durations are superposed. The output of the RF substrate biasing power supply 114 or 207 is switched between a high output value (ON) and a low output or 0 (OFF) in response to the values of the signals.

As for power supplied from the RF substrate biasing power supply 114 or 207 in the present embodiment, square waves or pulse waves having periods and durations of ON and OFF adjusted in values by the timing controller 206 or the pulse modulation signal generator 208 are superposed on the output of radio frequency power at a specific frequency. As a result, amplitude of radio frequency power at the specific frequency is increased and decreased to two values at each time in the ON and OFF states. As a result, as for a waveform of radio frequency power supplied to the inside electrode 202 and the outside electrode 203, for example, a waveform of voltage, a first term in the ON state and a subsequent second term in the OFF state are repeated with a predetermined period. The first term in the ON state has the frequency of radio frequency power generated by the RF substrate biasing power supply 114 or 207 and specific large amplitude. The second term in the OFF state has the same frequency and specific small amplitude or zero amplitude. In a case where the amplitude becomes zero in the OFF term, the radio frequency power is supplied intermittently.

In the present embodiment, such waveform adjustment of radio frequency power generated by the RF substrate biasing power supply 114 or 207 is referred to as time modulation. The duty is a parameter index used when conducting time modulation (or pulse modulation) on the output of the RF substrate biasing power supply 114 or 207.

In the case where the output of the RF substrate biasing power supply 114 or 207 becomes intermittent, a frequency that determines the period of intermittence is set in the timing controller 206 or the pulse modulation signal generator 208. In the present embodiment, the duty is set as a rate of time for which the RF substrate biasing power from the RF substrate biasing power supply 114 or 207 becomes ON in one period of the frequency of the square wave or the pulse wave output by the timing controller 206 or the pulse modulation signal generator 208.

Figure 4:
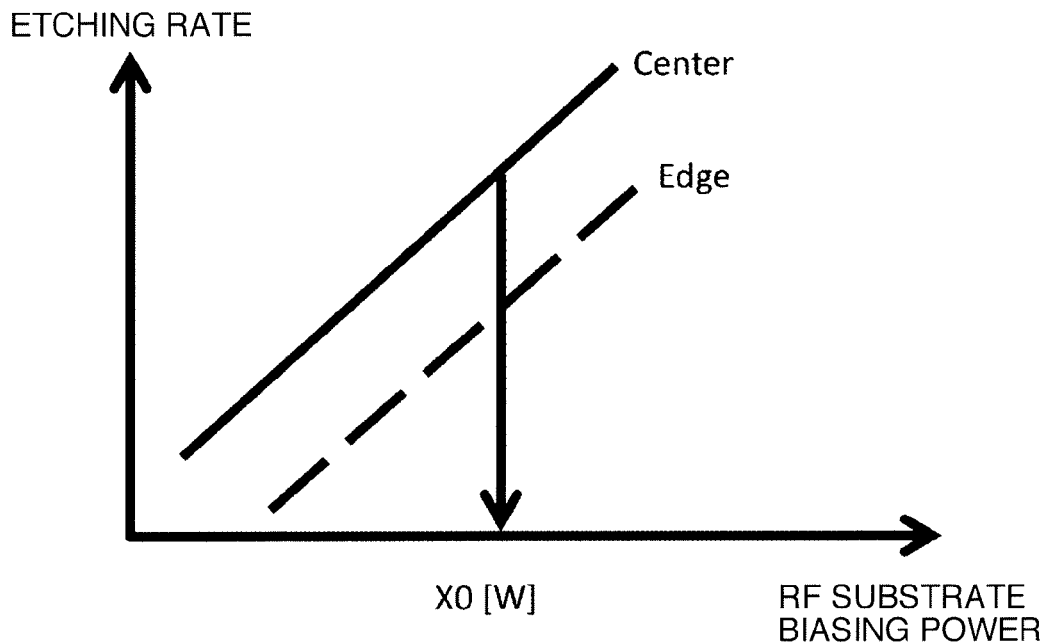
FIG. 4 is a graph schematically showing an example of distribution of etching rate in an in-surface direction of a wafer in the plasma processing apparatus shown in FIG. 1.

Adjustment of distribution of etching processing in the in-surface direction of the wafer 102 in the present embodiment will now be described with reference to FIGS. 4 to 15. FIG. 4 is a graph schematically showing an example of distribution of the etching rate in the in-surface direction of the wafer in the plasma processing apparatus shown in FIG. 1. FIG. 4 shows a case where an etching rate in an area of a center part of the wafer 102 is larger than an etching rate in an area of the peripheral side, i.e., a case where the etching rate (processing speed) in the in-surface direction assumes convex distribution. These etching rates exhibit dependence of being proportionate to the value of the RF substrate biasing power.

Figure 5:
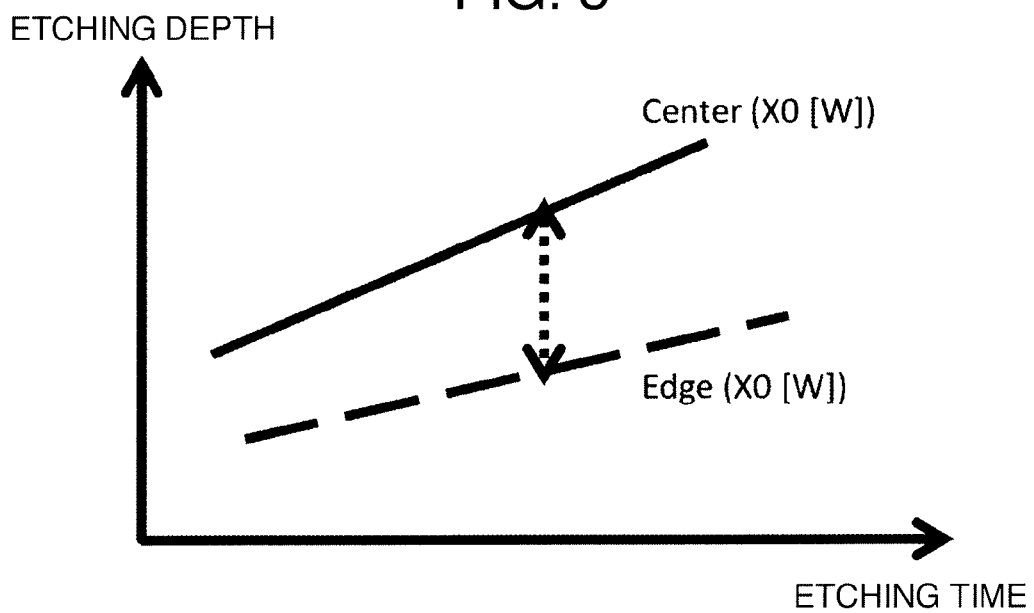
FIG. 5 is a graph schematically showing dependence of etching depth in the in-surface direction of the wafer upon etching time under a processing condition shown in FIG. 4.

Under a condition of a process for processing a film of a processing object of the wafer 102 having etching rate distribution in the wafer surface as shown in FIG. 4, the RF substrate biasing power is set equal to a predetermined value, for example, X0 [W]. Dependence of the etching depth in the in-surface direction of the wafer 102 upon the etching time in this case is shown in FIG. 5. FIG. 5 is a graph schematically showing dependence of etching depth in the in-surface direction of the wafer upon etching time under a processing condition shown in FIG. 4.

If the RF substrate biasing power is set equal to X0 [W], the etching depth in the center part of the wafer 102 becomes deep and the etching depth in the peripheral part of the wafer 102 becomes shallow as shown in FIG. 5. A problem of insufficient uniformity of the etching depth in the wafer surface is posed. On the other hand, in a plasma processing apparatus according to the conventional technique, the RF substrate biasing power applied to the wafer 102 cannot be changed in the in-surface direction of the wafer 102. In the present embodiment, however, the RF substrate biasing power applied to the wafer 102 can be changed in the in-surface direction of the wafer 102.

Figure 6:
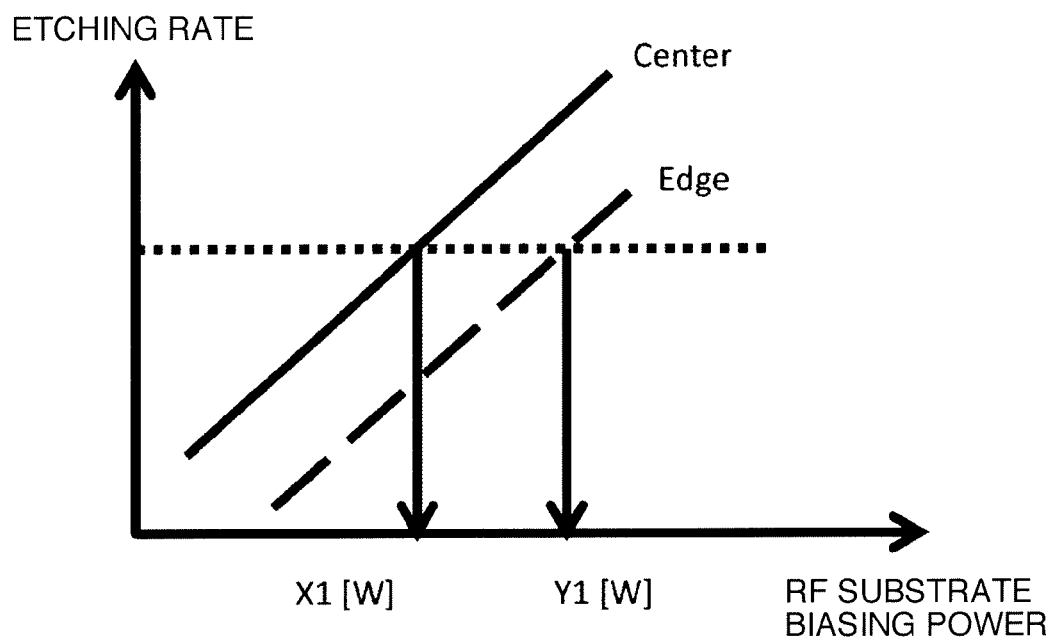
FIG. 6 is a graph schematically showing an example of values of radio frequency power supplied to an electrode in the wafer-mounting electrode in the embodiment shown in FIG. 1.

An example in which distribution of the RF substrate biasing power applied to the wafer 102 in the in-surface direction of the wafer 102 in the present embodiment has been adjusted is shown in FIG. 6. FIG. 6 is a graph schematically showing an example of values of radio frequency power supplied to the electrode in the wafer-mounting electrode in the embodiment shown in FIG. 1.

As shown in FIG. 6, a value of radio frequency power supplied to the outside electrode 203 is made different from a value of radio frequency power supplied to the inside electrode 202 in the in-surface direction of the wafer 102 to make the etching rate uniform in the in-surface direction of the wafer 102. In other words, in the control apparatus, the RF substrate biasing power in the center part of the wafer 102 is set equal to X1 [W] and the RF substrate biasing power in the peripheral part of the wafer 102 is set equal to Y1 [W]. Respective values are supplied to the inside electrode 202 and the outside electrode 203. As a result, the difference in etching rate between the center part of the wafer 102 and the peripheral part of the wafer 102 is reduced, and non-uniformity of the processing result is suppressed.

Figure 7:
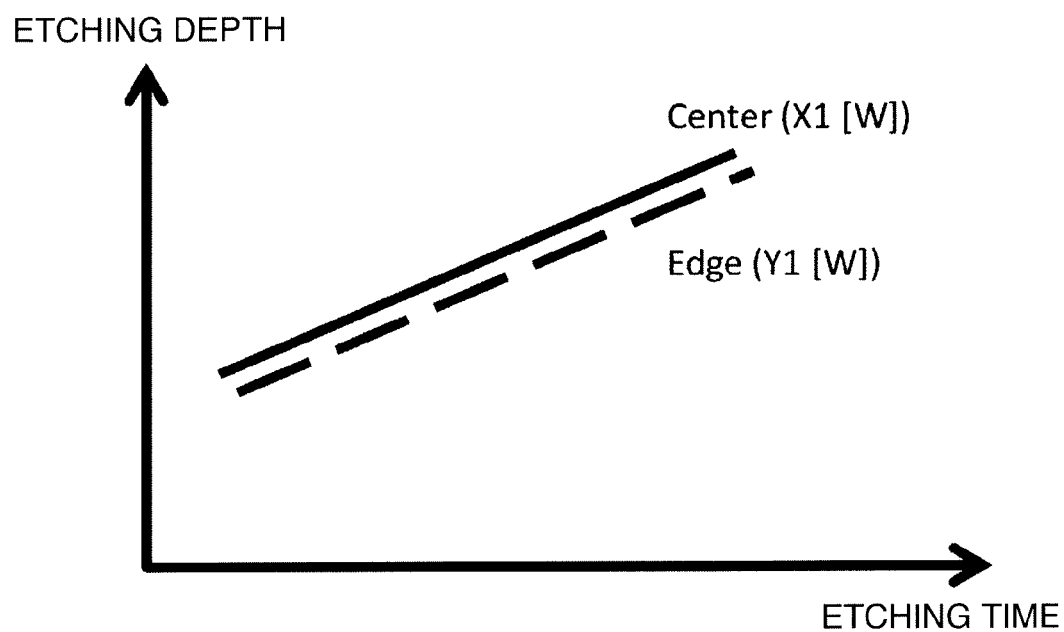
FIG. 7 is a graph schematically showing a result of etching processing in a case where radio frequency power is supplied to the electrode in the wafer-mounting electrode in the embodiment shown in FIG. 6.

Dependence of the etching depth in the wafer surface upon time in a case where etching is conducted by using the RF substrate biasing power set in FIG. 6 is shown in FIG. 7. FIG. 7 is a graph schematically showing a result of etching processing in a case where radio frequency power is supplied to the electrode in the wafer-mounting electrode in the embodiment shown in FIG. 6.

As shown in FIG. 7, non-uniformity of the etching rate in the in-surface direction of the wafer 102 is suppressed and uniformity of the etching depth is improved by making radio frequency power for forming bias potential in the in-surface direction of the wafer 102 distribute as shown in FIG. 6. In this way, in a process in which characteristics of processing in the in-surface direction of the wafer 102 assumes convex distribution, outputs of the RF substrate biasing power supply respectively to the inside electrode 202 and the outside electrode 203 are adjusted to obtain desired distribution. As a result, the characteristics of the processing can be made approach desired characteristics in the in-surface direction of the wafer 102.

In addition, the control apparatus refers to previously acquired data storing relations between values of the RF substrate biasing power and characteristics of processing, for example, the etching rate as shown in FIG. 4. The control apparatus adjusts the RF substrate biasing power supplied to the center part and the peripheral part to values to obtain a desired processing characteristic and results, for example, etching rate in the center part and the peripheral part of the wafer 102 on the basis of the data, and conducts processing. As a result, etching depth reduced in non-uniformity in the in-surface direction of the wafer 102 can be obtained as shown in FIG. 7.

Figure 8:
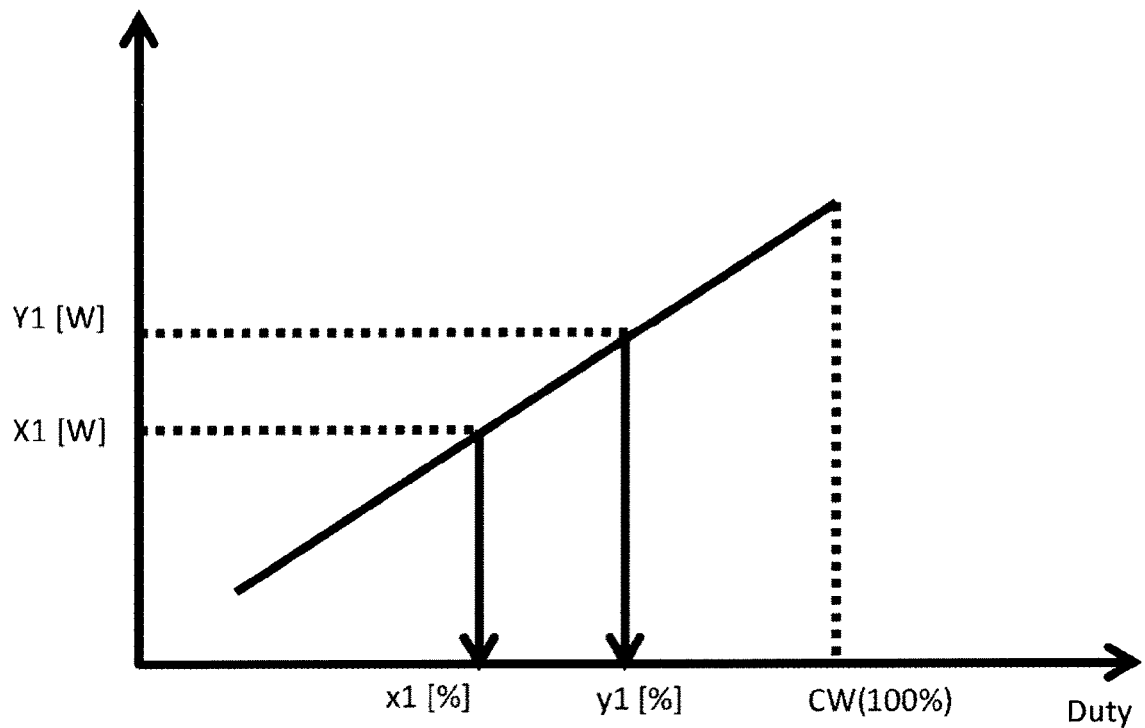
FIG. 8 is a graph schematically showing dependence of RF substrate biasing power upon duty in a case where RF substrate biasing power is output intermittently in the embodiment shown in FIG. 1.

In the present example, the RF substrate biasing power is adjusted by the timing controller 206, which is not illustrated and which has received a command signal from the control apparatus, on the basis of relations between the value of duty (period and duration of ON and OFF or its ratio) and average biasing power. Dependence of RF substrate biasing power upon the duty in a case where RF substrate biasing power is output intermittently is shown in FIG. 8. FIG. 8 is a graph schematically showing dependence of RF substrate biasing power upon the duty in a case where RF substrate biasing power is output intermittently in the embodiment shown in FIG. 1.

In the present example, the output power X1 [W] supplied to the inside electrode 202 corresponding to the center side part of the wafer 102 and the output power Y1 [W] supplied to the outside electrode 203 corresponding to the peripheral part of the wafer 102 are the RF substrate biasing power of the wafer 102 shown in FIG. 6. The output power X1 [W] and the output power Y1 [W] are adjusted by using a ratio between ON and OFF of the square wave or pulse wave originated from the timing controller 206. ON/OFF duties in different areas in the in-surface direction of the wafer 102 corresponding to the output power X1 [W] and the output power Y1 [W] are set to X1 [%] and Y1 [%], respectively. Signals of pulse waves and applied RF substrate biasing power in the case of FIG. 8 are shown in FIG. 9.

Figure 9:
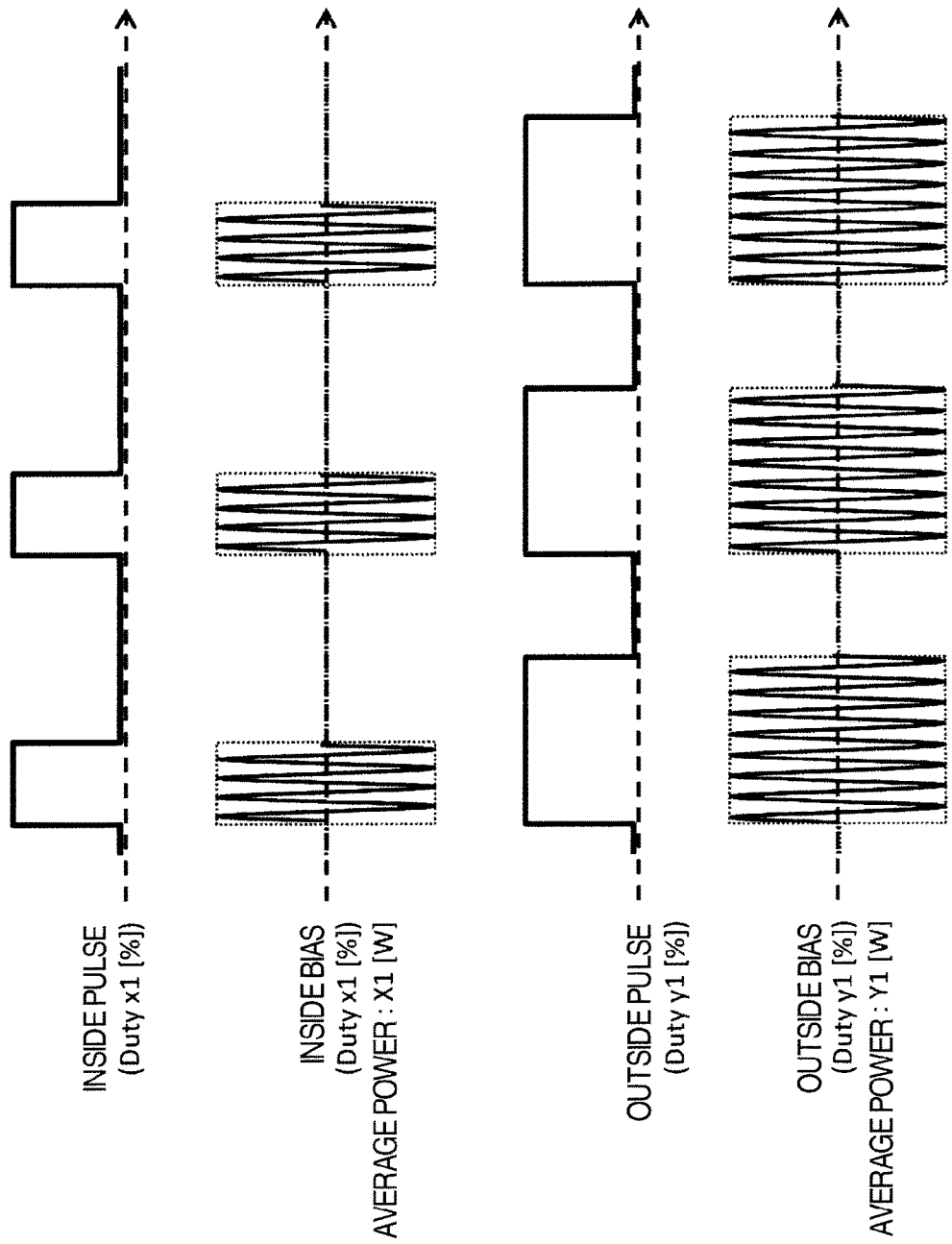
FIG. 9 is a graph showing an example of pulse waveforms or square waveforms output from a timing controller on the basis of duty setting shown in FIG. 8 and waveforms of RF substrate biasing power supplied to an inside electrode and an outside electrode.

FIG. 9 is a graph showing an example of pulse waveforms or square waveforms output from the timing controller 206 on the basis of duty setting shown in FIG. 8 and waveforms of RF substrate biasing power supplied to the inside electrode and the outside electrode. RF substrate biasing power supplied to the inside electrode 202 in the example in FIG. 8 is shown in FIG. 9. An inside pulse, which is a square wave or a pulse wave of duty X1 [%] supplied from an output end part for the inside of the timing controller 206, is superposed on radio frequency power of a predetermined frequency supplied from the RF substrate biasing power supply 114 or 207. Radio frequency power having predetermined amplitude and a predetermined frequency is output only in the ON term of the inside pulse, and amplitude becomes zero in the OFF term. In this way, a waveform of voltage in power becomes an intermittent waveform.

RF substrate biasing power supplied to the outside electrode 203 in the example in FIG. 8 is also shown in FIG. 9. An outside pulse, which is a square wave or a pulse wave of duty Y1 [%] supplied from an output end part for the outside of the timing controller 206, is superposed on radio frequency power of a predetermined frequency supplied from the RF substrate biasing power supply 114 or 207. Radio frequency power having predetermined amplitude and a predetermined frequency is output only in the ON term of the outside pulse, and amplitude becomes zero in the OFF term. In this way, a waveform of voltage in power becomes an intermittent waveform. In the present example, the value of the duty Y1 for the outside pulse is set to be larger than the value of the duty X1 for the inside pulse. This can also be appreciated from a fact that in the pulse waveforms in FIG. 9 the outside pulse is larger in ratio (duty ratio) of the ON term to the common repetition period than the inside pulse.

RF substrate biasing power having such waveforms is supplied to the inside electrode 202 and the outside electrode 203, respectively. As a result, waveforms of RF substrate biasing voltages formed on the respective electrodes become proportionate to waveforms of the RF substrate biasing power. In addition, a temporal average value of each of them becomes proportionate to a product of radio frequency power of a predetermined frequency supplied from the common RF substrate biasing power supply 114 or 207 and a value of the ratio (duty ratio) of the ON term in the pulse waveform to the pulse period. As a result, an average value of voltage in RF substrate biasing power supplied to the outside electrode 203 becomes larger than that in RF substrate biasing power supplied to the inside electrode 202. Consequently, a temporal average quantity of charged particles attracted from within the plasma 111 becomes larger in the outside region of the wafer 102 corresponding to the outside electrode 203 than in the center side region corresponding to the inside electrode 202.

Magnitude of the RF substrate biasing power supplied intermittently is adjusted to be variable in the area of the center part and the area of the peripheral part. As a result, it is possible to change characteristics of processing such as the etching rate and the etching depth for the film structure of the wafer 102 with respect to the radius direction of the wafer 102 and make the characteristics approach desired distribution. Consequently, plasma processing with variations in processing result in the radius direction of the wafer 102 suppressed can be implemented.

Especially, non-uniformity of the etching rate ranging from the center part of the wafer 102 to the peripheral part is reduced. Variations of the electrical characteristics and performance of the semiconductor device over the whole in the in-surface direction of the wafer 102 are suppressed. It is possible to bring about an effect that the yield is improved. Furthermore, it is possible to adjust the processing shape after the etching in the radius direction of the wafer 102 with high precision. As a result, it is possible to suppress variations of the electrical characteristics and performance of a semiconductor device manufactured from the wafer 102, resulting in an improved yield.

Figure 10:
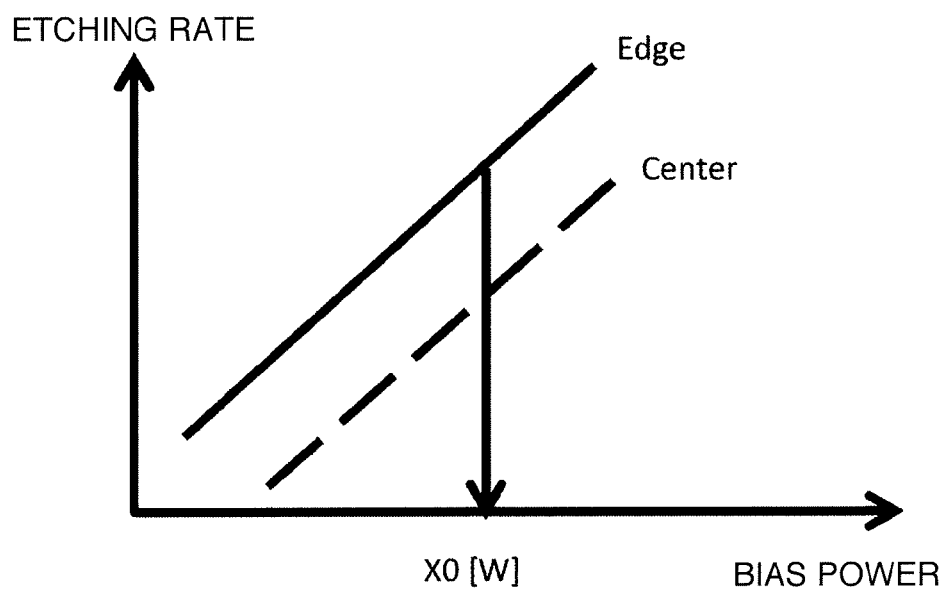
FIG. 10 is a graph schematically showing an example of the etching rate in the wafer surface in a case where a processing characteristic in the radius direction of the wafer assumes a concave shape.

Adjustment of the RF substrate biasing power for the case where the processing characteristic in the radius direction of the wafer 102 become a concave shape will be described with reference to FIGS. 10 to 15. FIG. 10 is a graph schematically showing an example of the etching rate in the wafer surface in the case where the processing characteristic in the radius direction of the wafer 102 assumes a concave shape.

FIG. 10 shows a case where the value of the etching rate in the radius direction of the wafer 102 is larger in the area of the peripheral side than the area of the center side and the etching rate assumes concave distribution. FIG. 10 also shows dependence of the etching rate upon the RF substrate biasing power. The RF substrate biasing power is set equal to, for example, X0 [W] in the etching process having etching rate distribution in the wafer surface as shown in FIG. 10. In this case, dependence of the value of the etching depth in the in-surface direction of the wafer 102 upon the value of the RF substrate biasing power becomes as shown in FIG. 11.

Figure 11:
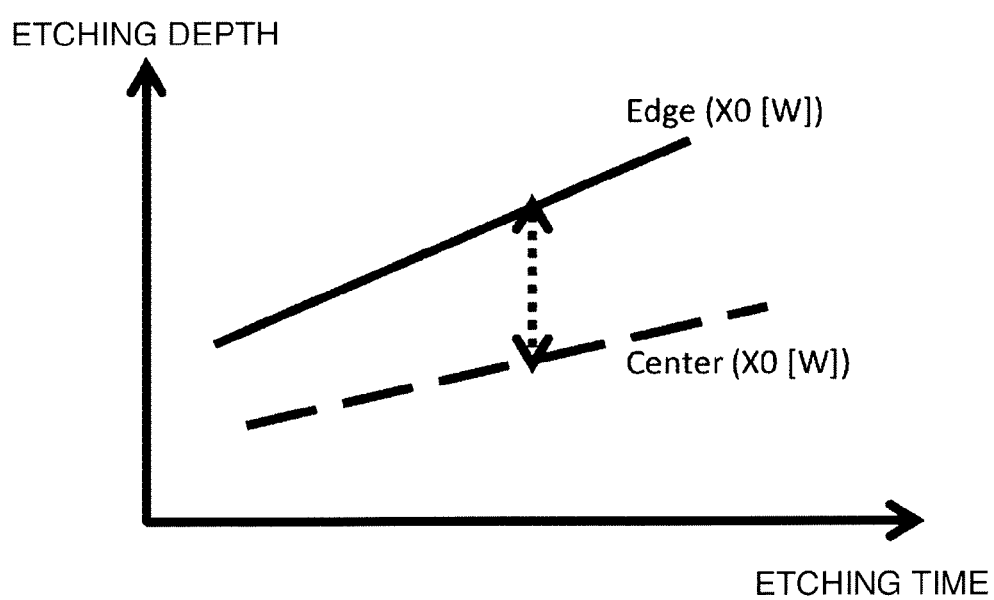
FIG. 11 is a graph schematically showing correlation between the value of etching depth in the in-surface direction of the wafer and the value of RF substrate biasing power in the example shown in FIG. 10.

In the case where the RF substrate biasing power is set equal to X0 [W] as shown in FIG. 11, the etching depth in the center part of the wafer 102 is shallow and the etching depth in the peripheral part of the wafer 102 is large in resultant distribution. There is a problem that the etching depth in the in-surface direction of the wafer 102 becomes non-uniform. This indicates that a problem that non-uniformity of the etching depth cannot be suppressed occurs in the plasma processing apparatus of the conventional technique in which the RF substrate biasing power applied to the wafer 102 cannot be changed in the in-surface direction of the wafer 102.

Figure 12:
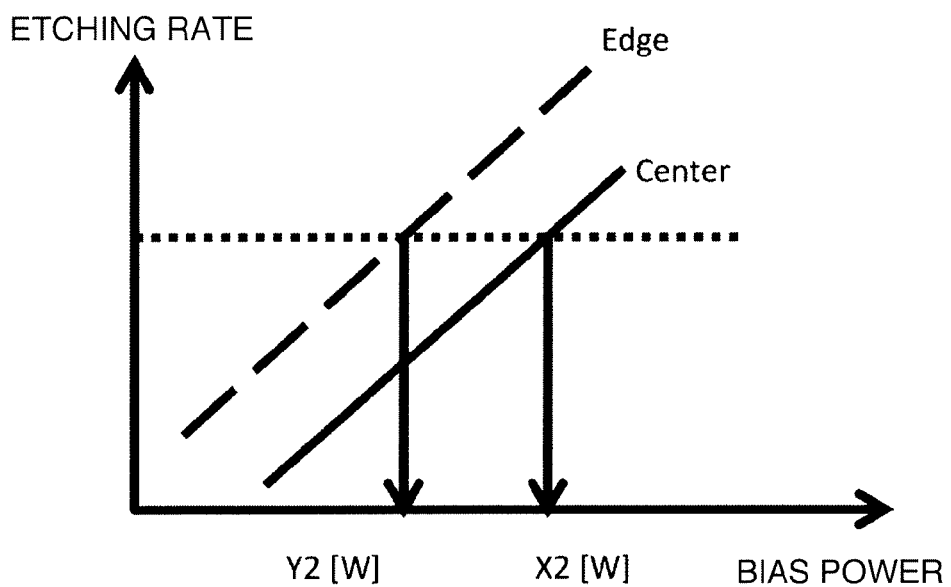
FIG. 12 is a graph showing an example of setting of RF substrate biasing power supplied to the inside electrode and RF substrate biasing power supplied to the outside electrode based on correlation between the etching rate and the RF substrate biasing power in the radius direction of the wafer in the example shown in FIG. 10.

On the other hand, in the present embodiment, the value of the RF substrate biasing power supplied to the inside electrode 202 corresponding to the center part of the wafer 102 is set equal to X2 [W] as shown in FIG. 12 on the basis of a command signal from the control apparatus, which is not illustrated. The value of the RF substrate biasing power supplied to the outside electrode 203 corresponding to the peripheral part of the wafer 102 is set equal to Y2 [W]. This aims at making the processing characteristic, for example, the etching rate uniform in the radius direction of the wafer 102. Especially, respective power values are set to reduce variations and difference in etching rate between the center part and the peripheral part of the wafer 102.

Figure 13:
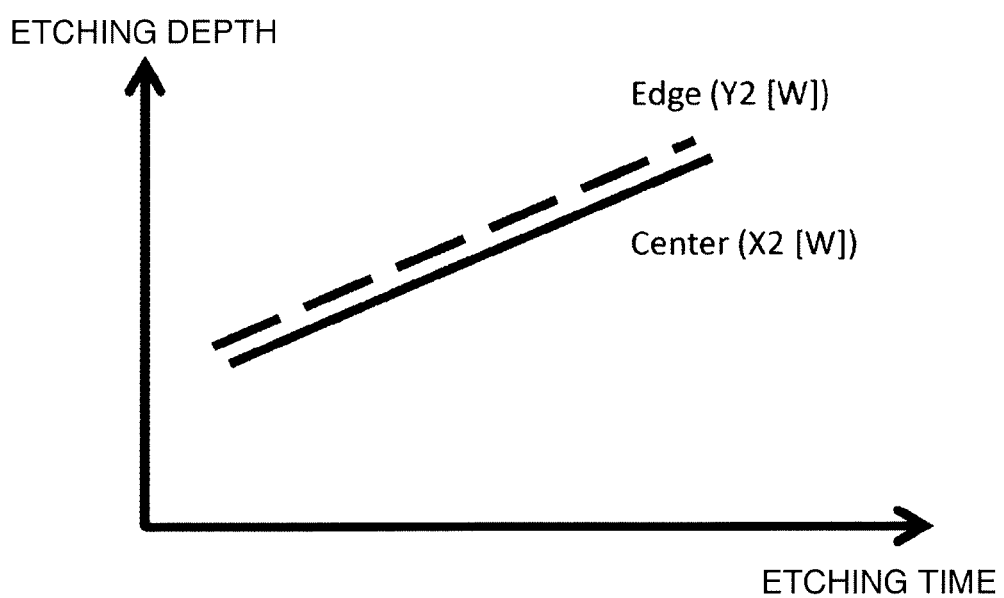
FIG. 13 is a graph schematically showing correlation between etching depth and etching time in a case where processing is conducted on the basis of setting shown in FIG. 12.

FIG. 13 shows dependence of the etching depth in the wafer surface upon the etching time in the case where etching is conducted on the wafer 102 by using the RF substrate biasing power set as shown in FIG. 12. In the example shown in FIG. 13, the timing controller 206 adjusts duties respectively of the inside electrode 202 and the outside electrode 203 to attain the RF substrate biasing power X2 [W] and Y2 [W] respectively set for the inside and outside areas in FIG. 12. As a result, non-uniformity of the etching rate in the wafer surface is reduced, and characteristics depending upon the etching time are made the same or similar. Consequently, uniformity of the etching depth in the in-surface direction is improved.

In the present embodiment, etching processing is conducted with RF substrate biasing power values that make the etching rate in the center part equal to that in the peripheral part as shown in FIG. 12 on the basis of the previously acquired relation between the biasing power and the etching rate as shown in FIG. 10. This brings about an effect that a uniform etching depth can be obtained in the wafer surface as shown in, for example, FIG. 13.

Figure 14:
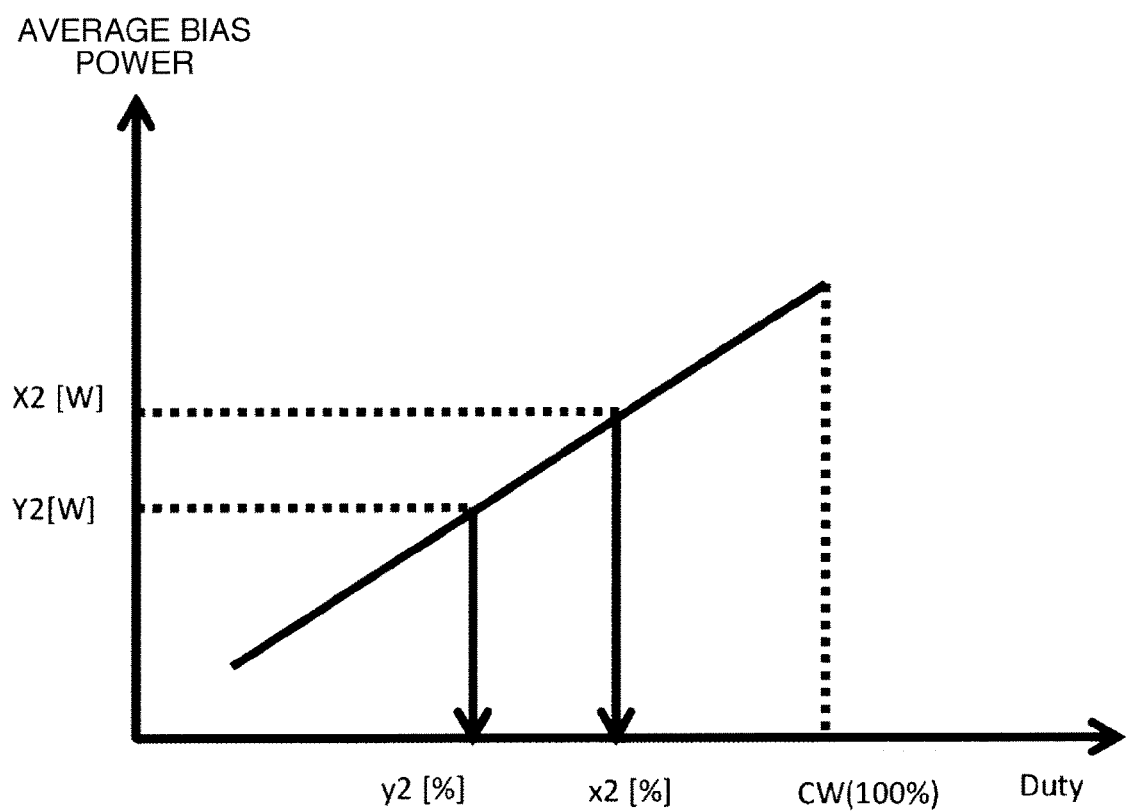
FIG. 14 is a graph schematically showing dependence of time average value of RF substrate biasing power upon the duty in a case where the RF substrate biasing power is output intermittently.

An example in which the RF substrate biasing power is controlled on the basis of the relation between the duty and the average biasing power by using the timing controller 206 will now be described with reference to FIGS. 14 and 15. FIG. 14 is a graph schematically showing dependence of time average value of RF substrate biasing power upon the duty in a case where the RF substrate biasing power is output intermittently.

In the present example, values of the RF substrate biasing power respectively supplied to the inside electrode 202 and the outside electrode 203 are set equal to output power X2 [W] in the wafer inside part and output power Y2 [W] in the wafer peripheral part by pulses output from the timing controller 206. The output power values X2 [W] and Y2 [W] are RF substrate biasing power values in the wafer surface shown in FIG. 12. Accordingly, duties of ON/OFF switching are adjusted respectively to X2 [%] and Y2 [%] in response to the signals from the timing controller 206. Pulse signals output from the timing controller 206 and applied radio frequency bias in such a case are shown in FIG. 15.

Figure 15:
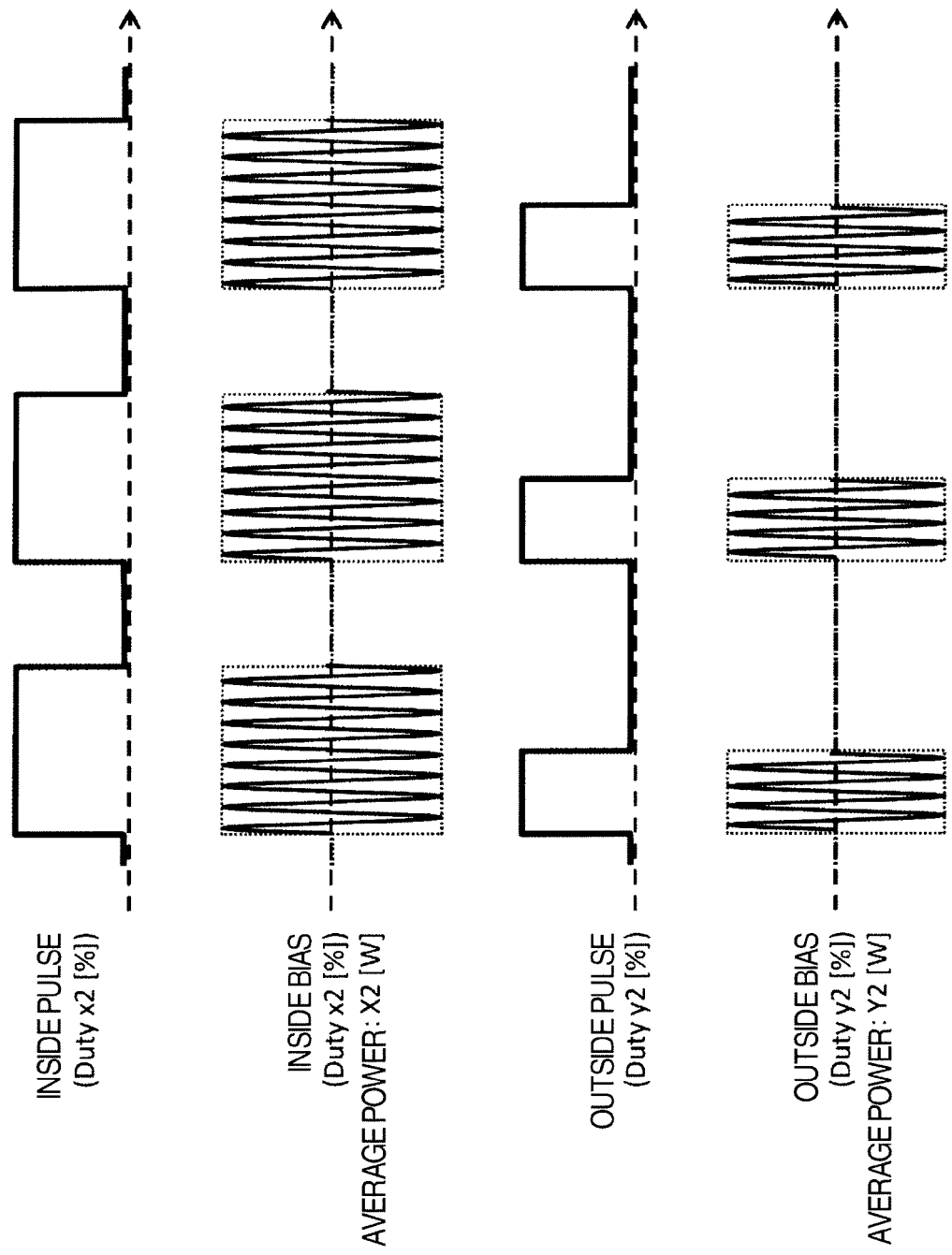
FIG. 15 is a graph showing an example of pulse waveforms or square waveforms output from the timing controller on the basis of duty setting shown in FIG. 14 and waveforms of RF substrate biasing power supplied to an inside electrode and an outside electrode.

FIG. 15 is a graph showing an example of pulse waveforms or square waveforms output from the timing controller on the basis of duty setting shown in FIG. 14 and waveforms of RF substrate biasing power supplied to the inside electrode and the outside electrode. RF substrate biasing power supplied to the inside electrode 202 in the example in FIG. 14 is shown in FIG. 15. An inside pulse, which is a square wave or a pulse wave of duty X1 [%] supplied from an output end part for the inside of the timing controller 206, is superposed on radio frequency power of a predetermined frequency supplied from the RF substrate biasing power supply 114 or 207. Radio frequency power having predetermined amplitude and a predetermined frequency is output only in the ON term of the inside pulse. In this way, a waveform of voltage in power becomes an intermittent waveform.

RF substrate biasing power supplied to the outside electrode 203 in the example in FIG. 14 is also shown in FIG. 15. An outside pulse, which is a square wave or a pulse wave of duty Y2 [%] supplied from an output end part for the outside of the timing controller 206, is superposed on radio frequency power of a predetermined frequency supplied from the RF substrate biasing power supply 114 or 207. Radio frequency power having predetermined amplitude and a predetermined frequency is output only in the ON term of the outside pulse. In this way, a waveform of voltage in power becomes an intermittent waveform. The value of the duty X2 for the inside pulse is set to be larger than the value of the duty Y2 for the outside pulse. Corresponding thereto, the inside pulse is larger in duty ratio than the outside pulse.

RF substrate biasing power having such waveforms is supplied to the inside electrode 202 and the outside electrode 203, respectively. As a result, a temporal average value of the RF substrate biasing voltage formed on each electrode is proportionate to a product of radio frequency power of a predetermined frequency supplied from the common RF substrate biasing power supply 114 or 207 and a value of the duty ratio of each voltage. As a result, an average value of voltage in RF substrate biasing power supplied to the inside electrode 202 is made larger than that in RF substrate biasing power supplied to the outside electrode 203. In this way, magnitude of the RF substrate biasing power supplied intermittently is adjusted to be variable in the area of the center part and the area of the peripheral part. As a result, it is possible to change characteristics of processing such as the etching rate and the etching depth for the film structure of the wafer 102 with respect to the radius direction of the wafer 102 and make the characteristics approach desired distribution. Consequently, plasma processing with variations in processing result in the radius direction of the wafer 102 suppressed can be implemented.

Owing to the above-described configuration, uniformity in processing characteristic in the in-surface direction of the wafer 102, for example, in the value of the etching rate and etching depth is improved. The yield of manufactured semiconductor devices is improved. In addition, the value of duty and its distribution with respect to the radius direction of the wafer 102 adjusted in the above-described example are hard to be influenced from values of ion energy and internal parameters of plasma 111 and so to speak independent. Therefore, occurrence of problems such as underlying layer slip and an insufficient mask selectivity caused by etch stop or excessive etching, which are problems of the conventional technique, can be suppressed.

In some processes (for example, a SiN process or the like), the etching rate becomes remarkably low because the byproduct concentration in the center part of the wafer 102 becomes high, or uniformity of the etching rate in the in-surface direction of the wafer 102 becomes remarkably low because of etch stop. An example in which the configuration of the above-described embodiment is applied to such processes will now be described.

Figure 16:
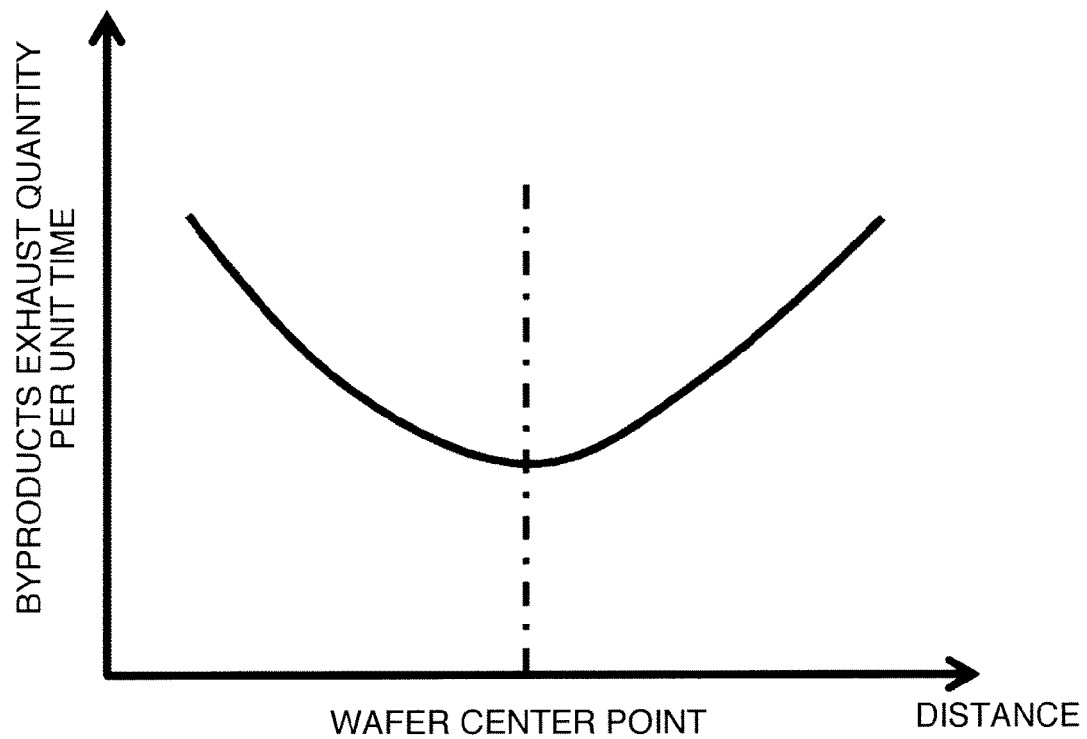
FIG. 16 is a graph schematically showing distribution of exhaust speed of byproducts in the radius direction of the wafer in the embodiment shown in FIG. 1.
Figure 17:
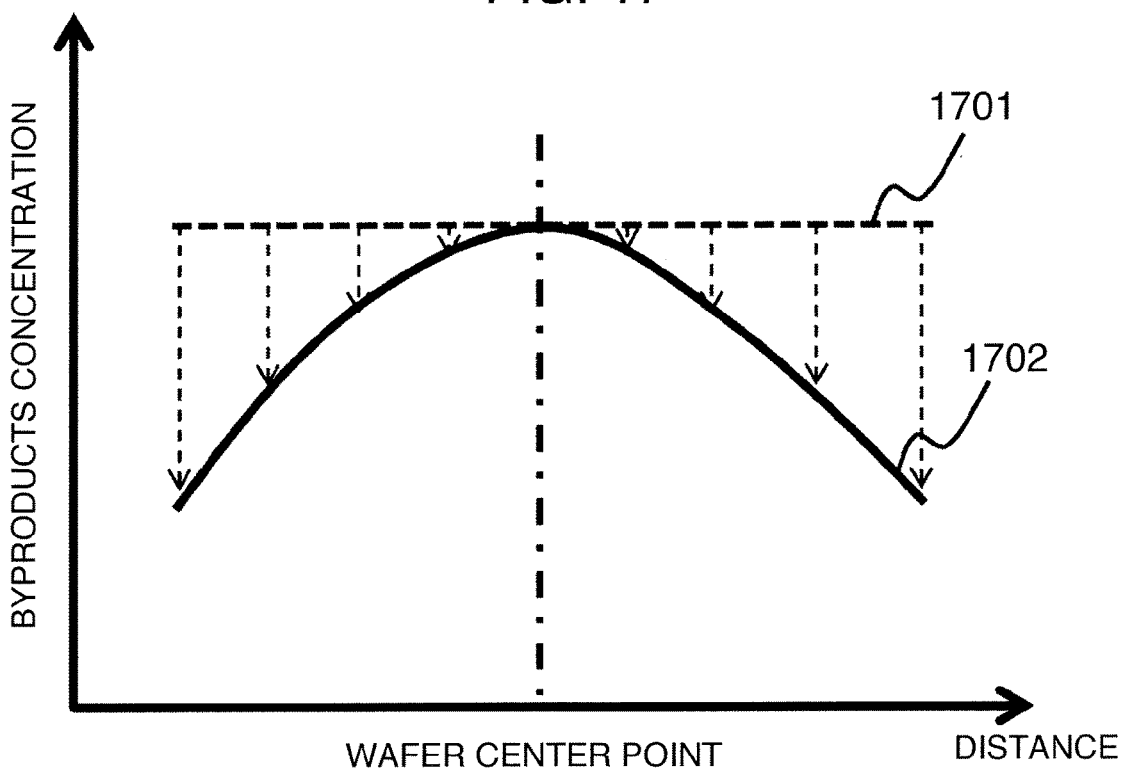
FIG. 17 is a graph schematically showing concentration distribution of byproducts in the radius direction of the wafer in the example shown in FIG. 16.

Dependence of exhaust quantity of byproducts per unit time upon the radius direction of the wafer in the etching process that depends intensely upon the byproducts distribution is shown in FIG. 16. As shown in FIG. 16, the byproducts exhaust quantity per unit time is low in the center part of the wafer and becomes higher as the peripheral part is approached. Resultant concentration distribution of byproducts in the wafer surface is shown in FIG. 17. A curved line 1701 indicates concentration distribution of byproducts generated immediately after the processing start, and a curved line 1702 indicates distribution obtained t seconds after that. Since the exhaust quantity in the center part is lower than the exhaust quantity in the peripheral part, distribution of byproducts becomes convex distribution with respect to the radius direction of the wafer. In such a process, in-surface control of exhaust time of byproducts is effective.

In the case where the present embodiment is used, the exhaust time of byproducts in the center part of the wafer can be made sufficiently long and influence of byproducts can be reduced remarkably by exercising control to make the duty of the RF substrate bias near the center part of the wafer sufficiently long. In other words, the timing controller 206 is controlled to make the duty of the RF substrate bias near the center part of the wafer smaller than the duty of the RF substrate bias near the peripheral part of the wafer. As a result, the byproducts concentration distribution in the wafer surface can be made uniform and uniformity of CD or the like of the etching pattern in the wafer surface can be improved.

Figure 18:
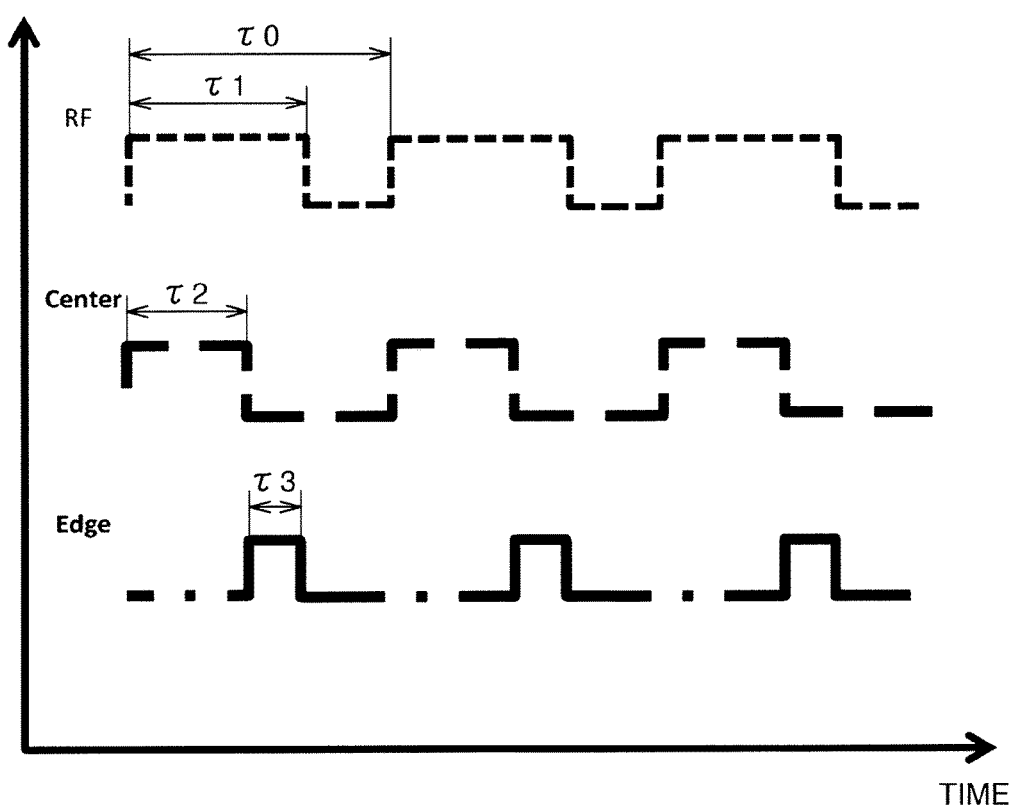
FIG. 18 is a graph showing another example of RF substrate biasing power adjusted in value and distribution in the radius direction of the wafer-mounting electrode and supplied in the plasma processing apparatus in the embodiment shown in FIG. 1.
Figure 19:
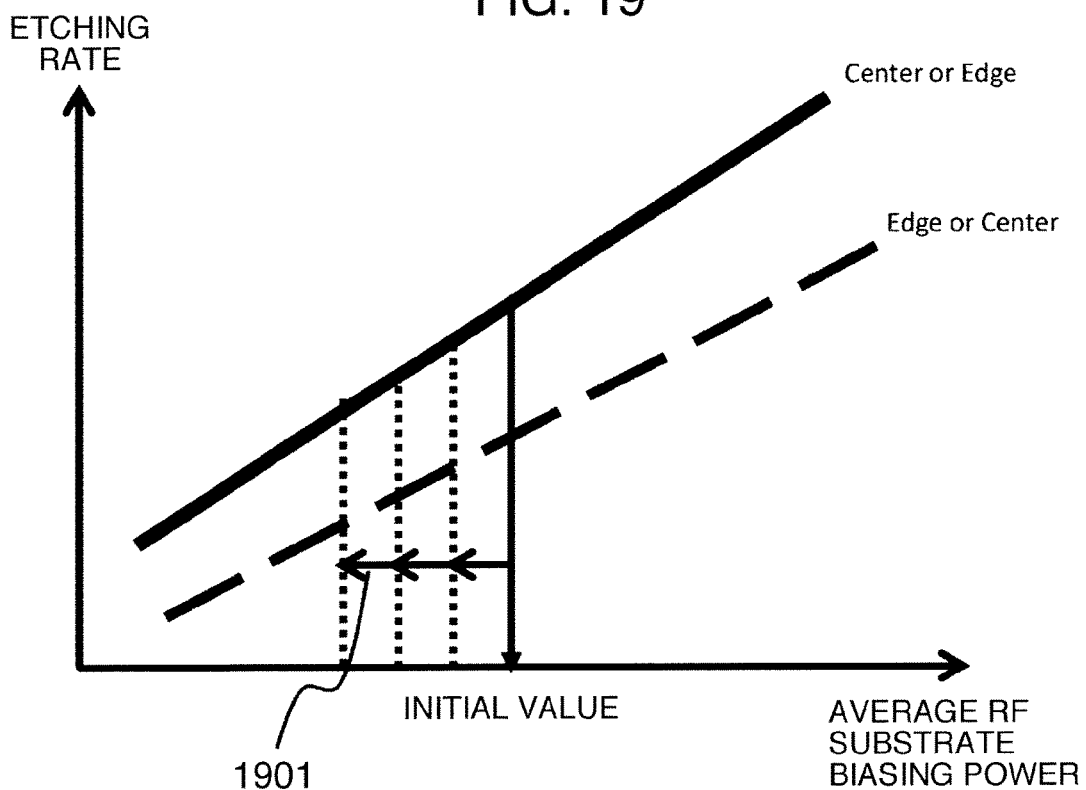
FIG. 19 is a graph schematically showing a relation between the wafer etching rate and a time average value of RF substrate biasing power in a case where the duty of RF substrate biasing power to an inside area and an outside area of the wafer-mounting electrode is adjusted by using outputs from film thickness monitors in the embodiment shown in FIG. 1.

Another example of a configuration in which the value and distribution of the RF substrate biasing power supplied to the wafer-mounting electrode 103 in the radius direction of the wafer 102 are adjusted variably will now be described with reference to FIGS. 18 and 19. FIG. 18 is a graph showing another example of RF substrate biasing power adjusted in value and distribution in the radius direction of the wafer-mounting electrode and supplied in the plasma processing apparatus in the embodiment shown in FIG. 1.

Power from the RF substrate biasing power supply 114 or 207 is intermittent with a predetermined period and duration or has a repetition of a high output and a low output in response to the pulse wave or square wave signal supplied from the pulse modulation signal generator 208. The power is supplied to the inside electrode 202 (Center) and the outside electrode 203 (Edge) by operation of the electrical high-speed relays 204 and 205 responsive to a signal from the timing controller 206. In FIG. 18, an output (voltage in the present example) from the RF substrate biasing power supply has a pulse waveform, which is repeated in a pulse form with a period $\tau 0$. For a specific time $\tau 2$ from time when an ON term is started in the ON term $\tau 1$, the electrical high-speed relay 204 corresponding to the inside electrode 202 (Center) on the center side of the wafer 102 is brought into the ON state, and the RF substrate biasing power is applied to the inside electrode 202 (Center).

For a specific term $\tau 3$ from time when the electrical high-speed relay 204 connected to the inside electrode 202 on the center side of the wafer 102 is turned OFF after elapse of $\tau 2$, the electrical high-speed relay 205 connected to the outside electrode 203 corresponding to the outside of the wafer 102 is brought into the ON state. The ON state is continued until the ON term $\tau 1$ of the RF substrate biasing power of the RF substrate biasing power supply finishes and the OFF term is started. By the way, in the present example, the period with which each of the electrical high-speed relays 204 and 205 respectively corresponding to the inside electrode 202 and the outside electrode 203 repeats the ON and OFF states eventually becomes equal to $\tau 0$.

Such supply of the RF substrate biasing power is conducted. As a result, while adjusting the OFF time of the center part or the peripheral part of the wafer 102 and a value of temporal average of applied bias power to arbitrary values, the center part and the peripheral part is etched alternately and intermittently. Consequently, etching characteristics respectively of the center part and the peripheral part of the wafer 102 are adjusted independently. Furthermore, influence of byproducts that have dropped off from the center part of the wafer 102 on the etching of the peripheral part of the wafer 102 is reduced, or adjustment to a desired state can be conducted. or the reverse effect can be obtained. An area where the process condition can be selected can be made large. As a result, the yield of the processing can be improved.

In other words, owing to the above-described configuration, adjustment of the processing characteristic becomes possible on the basis of the concentration of byproducts in the in-surface direction of the wafer 102 and applied average RF substrate biasing power. Furthermore, as compared with the case where the center part and the peripheral part are etched simultaneously, the quantity of byproducts staying in the air over the wafer during etching is also reduced. Therefore, there is also an effect that the influence of byproducts on the etching is reduced.

Owing to the present system, uniformity of the etching rate in the wafer surface is improved. Consequently, improvement of the yield of etching products can be expected. In addition, in the present system, it is also possible to eliminate the non-uniformity of the etching rate in the surface due to obstruction against etching incurred by byproducts.

In a process for which correlation between the RF substrate biasing power and the etching rate is not known previously or it is desired to control the etching depth more strictly, the value and distribution of the RF substrate biasing power in the radius direction of the wafer 102 of the wafer-mounting electrode 103 are adjusted. The adjustment is conducted as follows by using outputs of the film thickness monitors 301 and 302. As a result, improvement of uniformity of the processing characteristic in the radius direction of the wafer 102 can be obtained.

Figure 20:
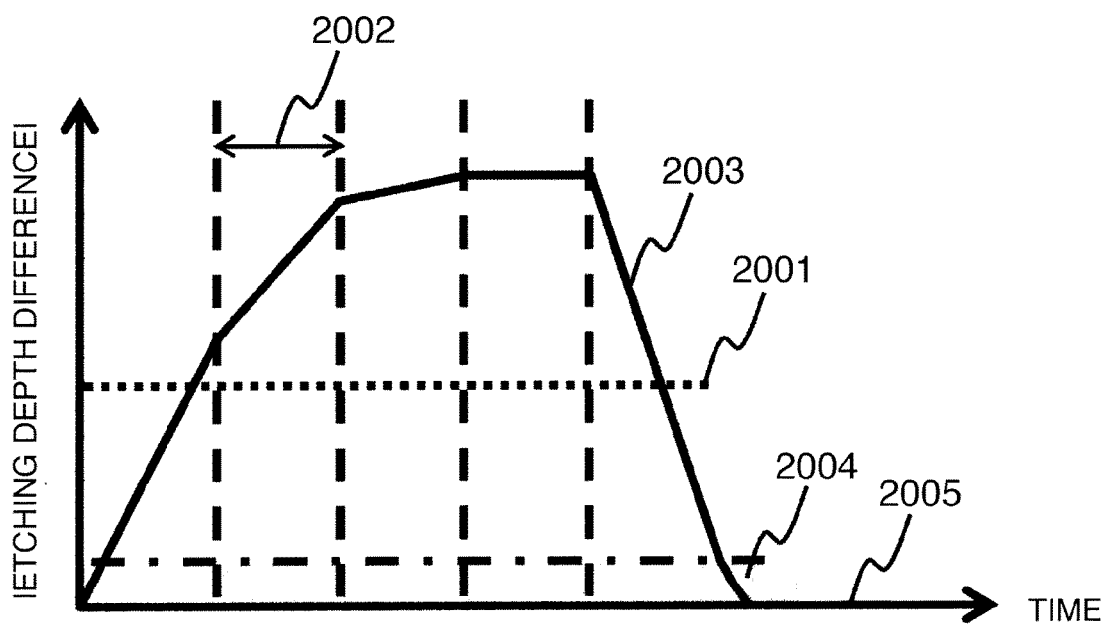
FIG. 20 is a graph showing an example of change of etching depth with a shift of etching time in the example shown in FIG. 19.

An example in which processing is adjusted by using film thickness detected by using film thickness monitors during the processing in the embodiment shown in FIG. 1 will now be described with reference to FIGS. 19 to 21. In the present example, the film thickness of the layer to be etched is monitored successively by using the film thickness monitors 301 and 302. The duty of the RF substrate bias applied to the center part/peripheral part of the wafer is automatically controlled to make the etching depth uniform in the wafer surface.

The duty of RF substrate biasing power to the inside area and the outside area of the wafer-mounting electrode is adjusted by using outputs from the film thickness monitors in the present example. FIG. 19 is a graph schematically showing a relation between the wafer etching rate and a time average value of RF substrate biasing power in this case. FIG. 20 is a graph showing an example of change of etching depth with a shift of etching time in the example shown in FIG. 19.

During the etching processing, a control apparatus, which is not illustrated, detects the etching depth in a specific area in the center side part and a specific area in the peripheral side part by using data detected optically by using the film thickness monitors 301 and 302. In a case where an absolute value difference between these values has become at least a prescribed allowable value (2001), the duty (ratio) on the side detected to be high in etching rate is made small with a prescribed step width (1901) as shown in FIG. 19.

At this time, the step width (1901) is set equal to a sufficiently small value on the basis of a result of test processing executed on the test wafer previously. As a result, the phenomenon that the value of increase or decrease of the etching rate conducts hunting and settling is not obtained in a short time is suppressed. It becomes possible to set the etching rate in the center part and the peripheral part equal to a desired value by stages with high precision.

Figure 21:
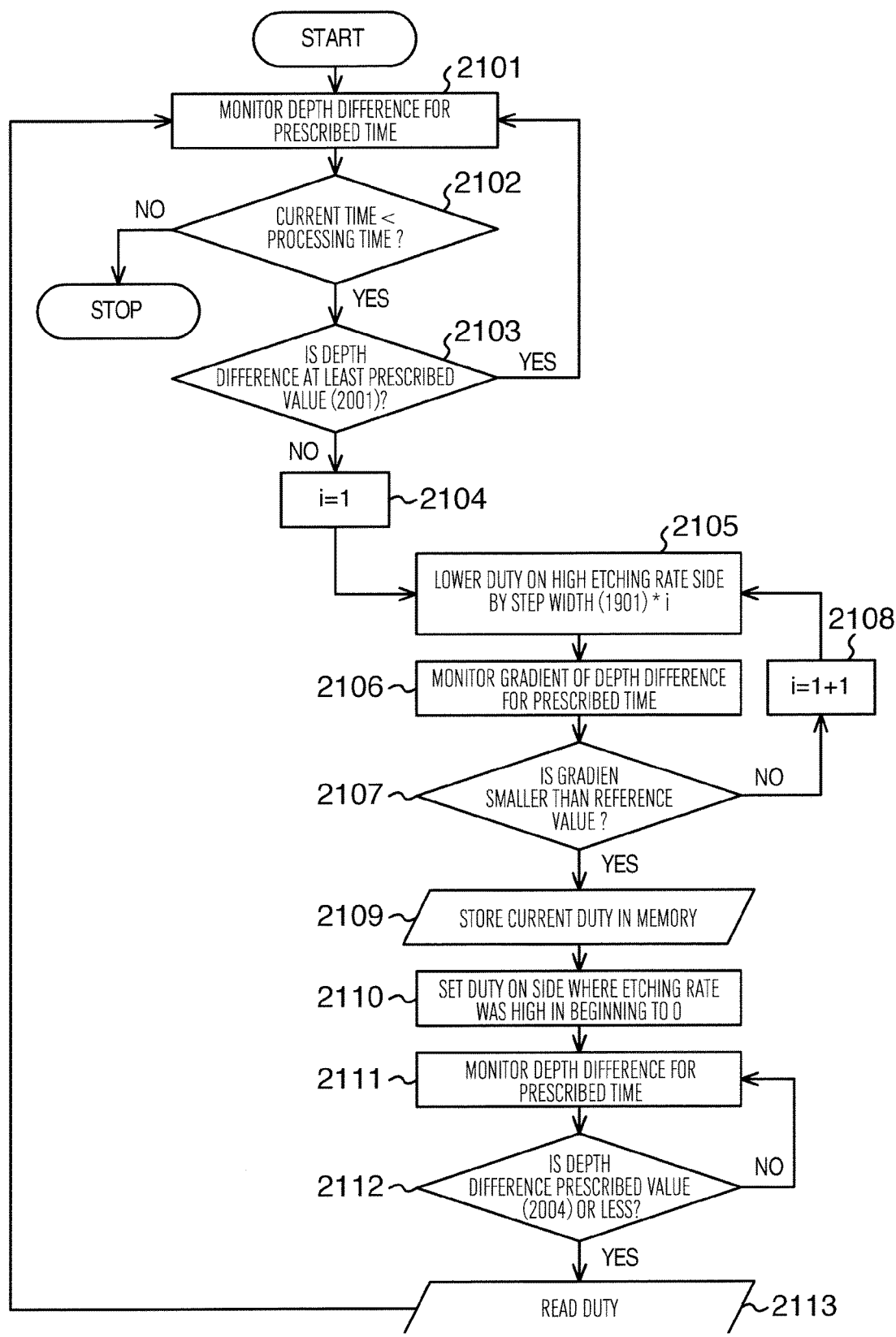
FIG. 21 is a flow chart showing a flow of adjustment of etching processing operation shown in FIGS. 19 and 20 executed in the example shown in FIG. 1.

An example of flow of such an operation of controlling the duty and etching characteristics is shown in FIG. 21. FIG. 21 is a flow chart showing a flow of adjustment of etching processing operation shown in FIGS. 19 and 20 executed in the example shown in FIG. 1.

In the plasma processing apparatus in the present example, the etching depth difference between the center part and the peripheral part of the wafer is monitored by using the film thickness monitors 301 and 302 and detected by the control apparatus with a prescribed time width (2002) between the etching processing start and the processing end (step 2101). In step 2102, the control apparatus confirms the current time after the processing start. In a case where it is determined that a preset processing time has elapsed (step 2102: No), the processing is stopped in response to a command from the control apparatus.

In a case where it is determined that the preset processing time has not elapsed (step 2102: Yes), the processing proceeds to step 2103 and the control apparatus determines whether the difference of etching depth between the center part and the peripheral part obtained as a result of monitoring is outside an allowable range. In a case where it is determined that the difference is within the allowable range, the processing returns to step 2101 and the processing is continued.

If it is determined that the difference in the etching depth between the center part and the peripheral part has exceeded the allowable value, the processing proceeds to step 2105 via step 2104. In step 2105, the duty on the high etching rate side is reduced by the preset step width (1901) on the basis of a command from the control apparatus. Subsequently, detection of the etching depth using the film thickness monitors 301 and 302 is executed for a predetermined time. The control apparatus detects a change quantity of the difference of the etching depth with time, i.e., gradient at predetermined time intervals (step 2106).

Subsequently, in step 2107, it is detected whether the gradient of the depth difference detected in step 2106 has become a predetermined reference value (such as, for example, 0.1). The reference value is an arbitrary value that is small enough to regard etching rate values in different detection positions in the radius direction of the wafer 102 as equal values. Until the detection, the process of reducing the duty on the basis of the prescribed step width and the process of detecting the change rate of etching depth difference in the processing with the duty ratio and comparing the change rate with the reference value are repeated as indicated by steps 2105 to 2108. If the control apparatus determines that the change rate of the depth difference has become smaller than the reference value, i.e., that the etching rate in the center part of the wafer 102 can be regarded to have become equal to that in the peripheral part, current information of duty in the center part and the peripheral part is stored. The current information of duty is stored in a storage apparatus or a memory such as a RAM, a flash memory, or a hard disk disposed in the control apparatus (step 2109). In order to eliminate the depth difference once, the duty on the side where the etching rate was higher in the beginning is set equal to zero, and etching on that side is stopped (step 2110 and step 2003 in FIG. 20).

Thereafter, processing on the other side is continued. The control apparatus detects the etching depth difference by using outputs of the film thickness monitors 301 and 302 during the processing on the other side as well (step 2111). The control apparatus determines whether the depth difference has arrived at a buffer area (2004 in FIG. 20), which is previously set to a suitable value considering a time lag of duty control (step 2112). If the arrival is detected (Yes: step 2112), the control apparatus regards that the depth difference is eliminated, reads data representing the duty stored in step 2109 (step 2113), and returns to step 2101. The control apparatus starts processing again with the stored duties on the inside and outside and conducts processing with equal etching rates. As a result, etching processing is conducted in a state in which the etching depth in the surface is kept uniform (2005 in FIG. 20).

In a case where the film thickness monitor has detected that either of the center part and the peripheral part of the wafer has reached a desired etching depth earlier, automatic control of uniformity of the etching rate in the surface is also possible by duty control in the wafer surface.

Owing to the present system, uniformity of the etching rate in the wafer surface is improved. As a result, improvement of the yield of etching products can be expected. In addition, since the present system is a control system independent from the ion energy and internal parameters, the problems, such as the etch stop and over-etch, which are problems of the conventional technique, are also eliminated.

Embodiment 2

A different embodiment of the present invention will now be described with reference to FIGS. 22 to 26. The present embodiment relates to a plasma processing apparatus that is substantially equivalent to the plasma processing apparatus shown in FIG. 1. The present embodiment relates to a plasma processing method executed by the plasma processing apparatus.

For executing etching processing with high precision, it is necessary to adjust radical kind selection and the ion quantity to values suitable for processing by adjusting values of plasma intensity and density and its distribution. As means for adjusting the quantities of radicals and ions, pulse plasma is considered. In the pulse plasma, supply of an electric field for forming plasma is executed in time modulation and intermittent or high and low density plasma is formed alternately with a predetermined period. In such pulse plasma, ON and OFF of plasma or high and low intensities are repeated. Dissociation of particles in plasma is adjusted by adjusting the period and durations of ON and OFF of plasma or high and low intensities. Consequently, the dissociation state of radicals or the ion density is brought into a desired range suitable for processing.

A frequency (hereafter referred to as pulse frequency) of repetition of ON and OFF or high and low intensities in the pulse plasma, a ratio (duty ratio) of ON (high output) time to one period of repetition, and a ratio of ON (high output) time to OFF time is used as a parameter. It becomes possible to execute the etching processing with high precision by adjusting and setting the parameter during the processing or prior to the processing. The present embodiment is an example in which the wafer 102 is processed in the plasma processing apparatus shown in FIG. 1. In the example, a plurality of electrodes disposed in different positions or areas in the in-surface direction of the wafer 102 are supplied with RF substrate biasing power of different phases by using the pulse plasma. This case will now be described with reference to FIGS. 22 to 26.

Figure 22:
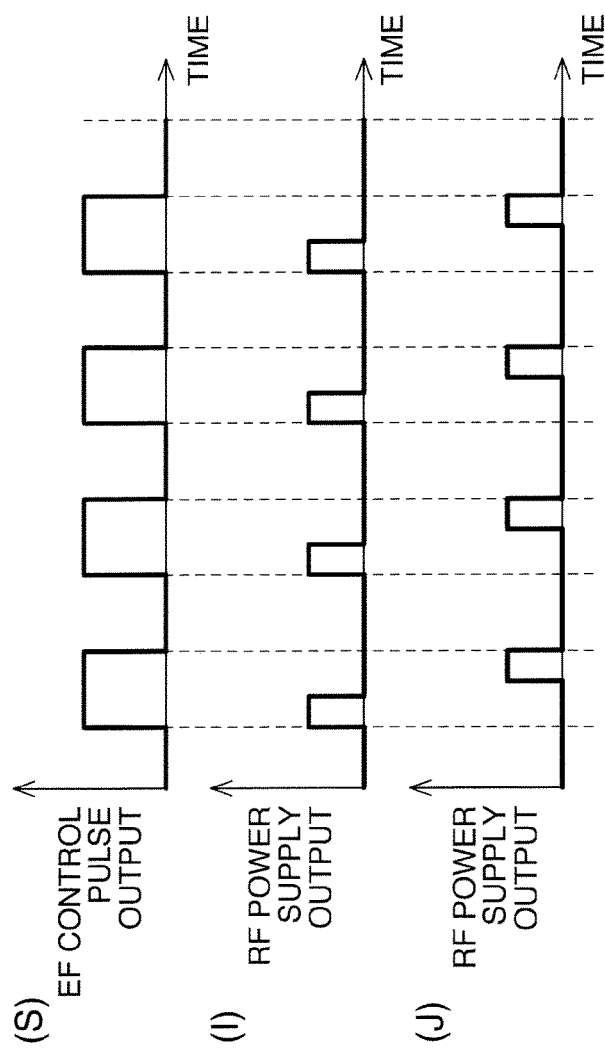
FIG. 22 is a time chart of plasma forming power and RF substrate biasing power and a table showing a result of processing, in a case where RF substrate biasing power having different phases are supplied to a plurality of electrodes disposed in different positions or areas in an in-surface direction of the wafer by using pulse plasma to process the wafer, in a plasma processing apparatus according to a second embodiment of the present invention.

In FIG. 22, (S) is a graph showing an example of a time chart of electric field (EF) control pulse output showing output of power that forms an electric field for generating plasma in the plasma processing apparatus in the present example. In FIG. 22, (I) and (J) are graphs showing an example of a time chart of the output (RF substrate biasing power) of the RF substrate biasing power supply 114 or 207. In (S), an example in which the repetition frequency is 1 kHz and the duty ratio is 50% is shown.

On the other hand, in (I) and (J), the repetition frequency is 1 kHz, the duty ratio is 20%, and the RF substrate biasing power is 100 W. (J) has a delay phase of 3 ms as compared with (I).

In FIG. 22, (a) is a table obtained by putting results together in a case where a film structure having films of predetermined kinds is processed under supply of the above-described plasma forming electric field and supply of RF substrate biasing power. No. 1 and No. 2 in (a) represent results obtained by measuring the etch rate in a blanket wafer of polysilicon (hereafter referred to as Poly) and a silicon oxide film (hereafter referred to as OX) as a film structure on the top surface of the wafer.

For example, in a case where desired etching performance is Poly etch rate uniformity: 2% or less, and OX selectivity:

at least 30, it is found from the table that they cannot be satisfied under the radio frequency bias condition in No. 1 and No. 2.

On the other hand, in the processing according to the present embodiment, the inside electrode 202 and the outside electrode 203 are disposed within the dielectric film 201, which forms a mounting surface of the top surface of the wafer-mounting electrode 103 corresponding to the center part of the wafer 102. The inside electrode 202 is disposed in a position or an area (a center part) corresponding to the center part of the mounting surface. The outside electrode 203 is disposed in a position or an area (an edge part) corresponding to the peripheral part of the mounting surface. In the processing according to the present embodiment, RF substrate biasing power supplied to the inside electrode 202 and RF substrate biasing power supplied to the outside electrode 203 are controlled independently, and the phase difference is adjusted with high precision. Therefore, RF substrate biasing power shown in (I) is applied to the center part and RF substrate biasing power shown in (J) is applied to the edge part.

As a result of such processing, etching characteristics shown in No. 3 are obtained. In No. 3, Poly etch rate uniformity: 2% or less, and OX selectivity: at least 30 can be satisfied. It is appreciated that control of etching characteristics with high precision becomes possible in the present embodiment.

Figure 23:
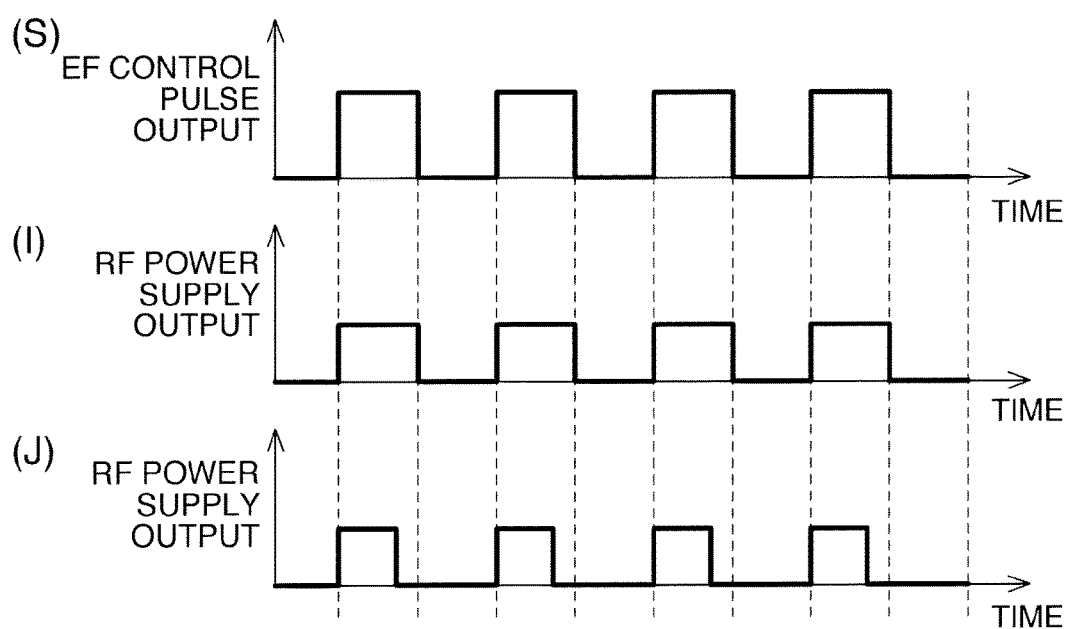
FIG. 23 is a time chart of plasma forming power and RF substrate biasing power and a table showing a result of processing in a modification of the embodiment shown in FIG. 22.

A case where RF substrate biasing power having different duty ratios is applied to electrodes disposed in different positions or areas in the in-surface direction of the wafer 102 will now be described with reference to FIG. 23. In FIG. 23, (S) is a graph showing an example of a time chart of an electric field control pulse output. In FIG. 23, (I) and (J) are graphs showing an example of a time chart of RF substrate bias power supply output.

In (S), the repetition frequency is 1 kHz and the duty ratio is 50%. In (I) and (J), the repetition frequency is 1 kHz and the radio frequency power supply output is 80 W. The duty ratio in (I) is 50%, and the duty ratio in (J) is 40%.

In FIG. 23, (a) is a table obtained by putting results together in a case where a film structure having films of predetermined kinds is processed under supply of the above-described plasma forming electric field and supply of RF substrate biasing power. Especially, No. 1 and No. 2 in (a) represent results obtained by measuring the etch rate in a blanket wafer of a silicon nitride film (hereafter referred to as SiN) as a film structure to be processed.

For example, in a case where demanded etching performance is SiN etch rate uniformity: 1% or less, it is found that they cannot be satisfied under the radio frequency bias condition in No. 1 and No. 2. On the other hand, in the configuration according to the present invention, radio frequency biasing power applied to the center part and radio frequency biasing power applied to the edge part are controlled independently and the phase difference is controlled with high precision. Therefore, processing is executed under the condition in No. 3 in which radio frequency power in (I) is applied to the center part and radio frequency power in (J) is applied to the edge part. As a result, etching characteristics shown in table (a) are obtained. It is appreciated that the demanded etching performance can be achieved.

Figure 24:
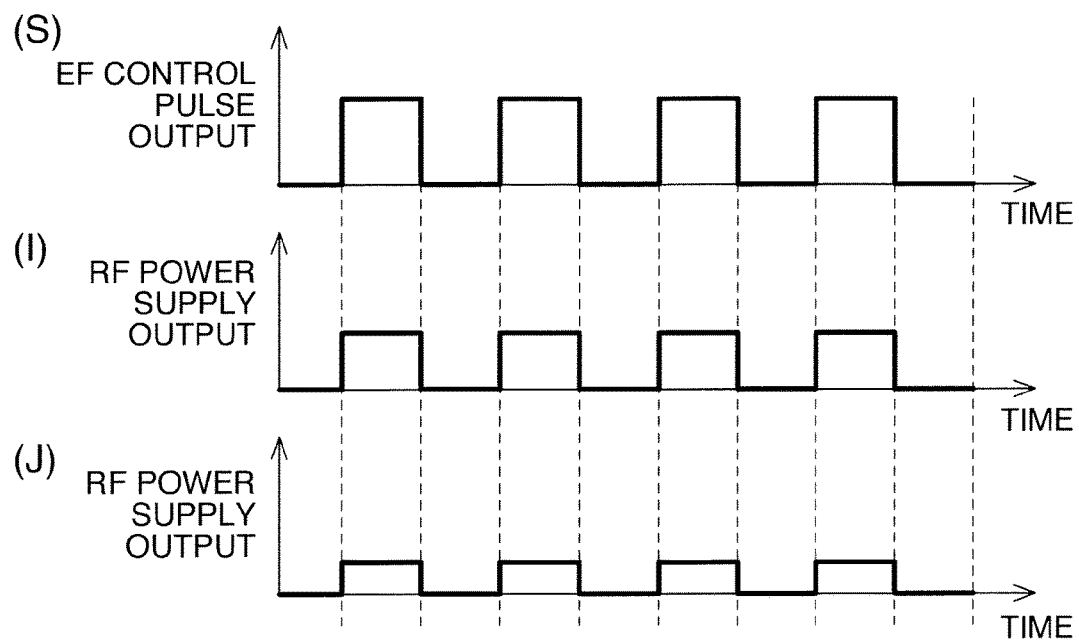
FIG. 24 is a time chart of plasma forming power and RF substrate biasing power and a table showing a result of processing in another modification of the embodiment shown in FIG. 22.

An example in which RF substrate biasing power having different amplitudes is applied to electrodes disposed in different positions or areas in the in-surface direction of the wafer 102 will now be described with reference to FIG. 24. In FIG. 24, (S) is a graph showing an example of a time chart of an electric field control pulse output. In FIG. 24, (I) and (J) are graphs showing an example of a time chart of RF substrate bias power supply output.

In (S), the repetition frequency is 1 kHz and the duty ratio is 50%. In (I) and (J), the repetition frequency is 1 kHz and the duty ratio is 50%. In (I), the output is 100 W. In (J), the output is 50 W. In FIG. 24, (a) is a table obtained by putting results together in a case where a film structure having films of predetermined kinds is processed under supply of the above-described plasma forming electric field and supply of RF substrate biasing power.

No. 1 and No. 2 in (a) represent results obtained by measuring the etch rate in a blanket wafer of Poly. For example, in a case where demanded etching performance is Poly etch rate uniformity: 1% or less, it is found that they cannot be satisfied under the radio frequency bias condition in No. 1 and No. 2. On the other hand, in the configuration according to the present invention, radio frequency biasing power applied to the center part and radio frequency biasing power applied to the edge part are controlled independently and the processing is executed under the condition of No. 3. As a result, etching characteristics shown in table (a) are obtained. It is appreciated that the demanded etching performance can be achieved.

Figure 25:
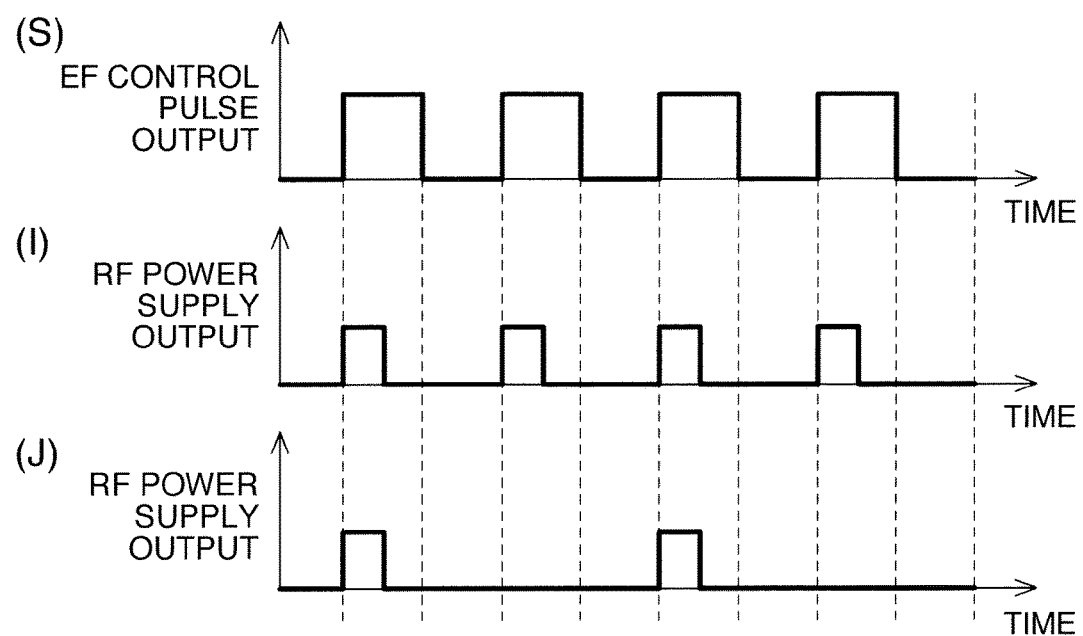
FIG. 25 is a time chart of plasma forming power and RF substrate biasing power in another modification of the embodiment shown in FIG. 22.

A case where radio frequency bias having different frequencies are applied to electrodes disposed in different positions or areas in the in-surface direction of the wafer 102 will now be described with reference to FIG. 25. In general, in an etching apparatus that uses vacuum, effect of exhaust becomes strong in the peripheral part of the wafer. Therefore, the density of byproducts of etching and plasma becomes high in the center. In etching for an etching film having a natural oxide film formed on the surface, a breakthrough step (hereafter referred to as BT) is generally applied to remove the surface layer. In FIG. 25, (S) is a graph showing an example of a time chart of an electric field control pulse output. In FIG. 25, (I) and (J) are graphs showing an example of time charts of RF substrate biasing power supply output.

As for the effect of the BT step, deposition of byproducts is larger in the center part of the wafer than the edge part. In some cases, therefore, BT in the center part becomes insufficient. In this case, there is a method of using radio frequency bias having different frequencies as represented by output waveforms (I) and (J) of radio frequency bias shown in FIG. 25. It is possible to conduct BT in the center part twice the number of times as compared with the edge part by applying radio frequency bias in (I) to the center part and radio frequency bias in (J) to the edge part.

The example in which one parameter is different in the center part and the edge part has been described above. Parameters may be combined as occasion demands. FIG. 26 shows an example thereof. In FIG. 26, (S) is a graph showing an example of a time chart of electric field control pulse output. In FIG. 26, (I) and (J) are graphs showing an example of a time chart of RF substrate biasing power supply output. In (S), the repetition frequency is 1 kHz, and the duty ratio is 50%.

In (I) and (J), the repetition frequency is 1 kHz. In (I), the duty ratio is 20% and the radio frequency power supply output is 50 W. In (J), the duty ratio is 10% and the radio frequency power supply output is 80 W. In FIG. 26, (a) is a sectional view of a film structure after etching processing, which schematically shows an example of a processing result obtained by conducting pattern etching on a Poly gate.

In FIG. 26, (i) shows an example of a result in a case where the radio frequency bias in (I) is applied to the center part and the edge part. In FIG. 26, (j) shows an example of a result in a case where the radio frequency bias in (J) is applied to the center part and the edge part.

In the case where the radio frequency bias in (I) is applied, the center becomes a taper shaped. Since the center part has generally more byproducts than the edge part, the shape of the center part is apt to become tapered under some conditions.

The taper shape can be made vertical by reducing the influence of byproducts. The influence of byproducts can be reduced by reducing the duty ratio. In a case where the duty ratio of the radio frequency bias is reduced, the OFF time becomes longer and the quantity of byproducts exhausted during the OFF time increases.

In the case where the duty ratio is decreased, flux of ions decreases and consequently the etching stop margin lowers sometimes. In the case of (J), therefore, the duty ratio is lowered by 10% from the condition in (I), but also the radio frequency bias output is lowered to 80 W.

In FIG. 26, (j) is the etching result. Although the shape in center becomes vertical, the edge becomes a side etch shape. Since byproducts are scarce in the edge, the side wall becomes insufficient and the side etch is caused.

In the method of applying the same radio frequency output or the same duty ratio to the center part and the edge part in this way, it is difficult to control the etching performance to eliminate the etching shape difference between the center and the edge. In the form of the present embodiment, however, it is possible to control the center part and the edge part independently.

A vertical shape can be obtained in both the center part and the edge part by applying the radio frequency bias in (J) to the electrode in the center part and applying the radio frequency bias in (I) to the electrode in the edge part. It becomes possible to control the etching shape with high precision by applying different duty ratios and different radio frequency bias outputs to the center part and the edge part.

In the described embodiment, the method of making the etching rate uniform in the wafer surface is mentioned as an example. However, it is also possible to control the etching rate in the surface from flat distribution to concave distribution or convex distribution freely by, for example, lowering or raising the RF substrate biasing power with the RF substrate biasing power that makes the etching rate uniform taken as reference.

In the embodiments, effects have been described centering around the pre-process of semiconductor device. However, similar action and effects are obtained even if the present invention is applied to etching processing technique in the following fields. The fields are post-process of semiconductors (wiring connection and super connection), micro-machine, MEMS field (including display field, optical switch field, communication field, storage field, sensor field, imager field, small-sized generator field, small-sized fuel battery field, micro-prober field, process gas control system field, and medical bio-field).

In the above-described embodiments, an example of plasma processing method using an etching apparatus that utilizes microwave ECR discharge has been described. However, similar actions and effects are also obtained in the dry etching apparatus utilizing other discharge (effective magnetic field UHF discharge, capacitively coupled discharge, inductively coupled discharge, magnetron discharge, surface wave excitation discharge, transfer coupled discharge). In the case where the ECR discharge is used, however, effects of higher precision can be obtained because of controllability of the distance between the principal plasma generation area and the wafer, reactivity of plasma with high dissociation, and an density increase of radicals. Therefore, ECR discharge is more desirable to obtain optimum effects.

The present invention is not restricted the above-described embodiments, but various modifications are included. For example, the above-described embodiments have been described in detail to describe the present invention intelligibly. The present invention is not restricted to an apparatus including all described configurations.

The invention claimed is:

1. A plasma processing method comprising:
   disposing a wafer to be processed on a sample stage within a processing chamber in a vacuum chamber;
   generating plasma in the processing chamber;
   supplying first radio frequency power to an electrode disposed on a part on a center side within the sample stage;
   supplying second radio frequency power to an electrode disposed on a part on a peripheral side within the sample stage,
   wherein a large amplitude and a small amplitude in each of the first and second radio frequency powers are repeated with predetermined periods which are respectively set in each of the first and second radio frequency powers;
   detecting rates of processing the wafer surfaces located at positions respectively corresponding to the part of the center side and the part of the peripheral side during the processing of the wafer surface; and
   adjusting, at least in one of the first and second radio frequency powers, a length of the large amplitude term, or a ratio of the length of the large amplitude term to one of the predetermined periods during the processing of the wafer based upon a result of the detected rates.

2. The plasma processing method according to claim 1, wherein in radio frequency powers supplied to the electrode on the center side and the electrode on the peripheral side, a large amplitude term in one of the radio frequency powers is started after a large amplitude term in the other of the radio frequency powers is finished.

3. The plasma processing method according to claim 1, wherein
   in an output from a radio frequency power supply which supplies a power for the first and second radio frequency powers, the large amplitude and the small amplitude are repeated with a period different from the period of the amplitude of first and second radio frequency powers respectively supplied to the electrode on the center side and the electrode on the peripheral side, and
   large amplitude terms in the first and second radio frequency powers respectively supplied to the electrode on the center side and the electrode on the peripheral side are included in large amplitude terms repeated with the different term in the output of the radio frequency power supply.

4. The plasma processing method according to claim 1, wherein in each of the radio frequency powers supplied to the electrode on the center side and the electrode on the peripheral side, an ON state having predetermined amplitude and an OFF state having zero amplitude are repeated with the period.

* * * * *